United States Patent
Okumoto et al.

(10) Patent No.: US 8,941,115 B2
(45) Date of Patent: Jan. 27, 2015

(54) THIN-FILM TRANSISTOR ELEMENT AND METHOD FOR MANUFACTURING SAME, ORGANIC ELECTROLUMINESCENT DISPLAY ELEMENT, AND ORGANIC ELECTROLUMINESCENT DISPLAY DEVICE

(71) Applicant: Panasonic Corporation, Osaka (JP)

(72) Inventors: Yuko Okumoto, Osaka (JP); Akihito Miyamoto, Osaka (JP); Takaaki Ukeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/968,567

(22) Filed: Aug. 16, 2013

(65) Prior Publication Data
US 2013/0328035 A1    Dec. 12, 2013

Related U.S. Application Data

(63) Continuation of application No. PCT/JP2012/005996, filed on Sep. 21, 2012.

(30) Foreign Application Priority Data

Nov. 14, 2011    (JP) .................................. 2011-248810

(51) Int. Cl.
*H01L 31/036*    (2006.01)
*H01L 29/04*    (2006.01)
(Continued)

(52) U.S. Cl.
CPC ........ *H01L 51/5253* (2013.01); *H01L 27/1225* (2013.01); *H01L 27/1292* (2013.01);
(Continued)

(58) Field of Classification Search
USPC ..................... 257/40, 59, 72, 79–83, 98–100; 438/25–29, 34, 48, 99, 149, 161, 197; 313/483, 500–506
See application file for complete search history.

(56) References Cited

U.S. PATENT DOCUMENTS 5,443,922 A    8/1995 Nishizaki et al.
8,729,534 B2 *    5/2014 Yoshida et al. .................. 257/40
(Continued)

FOREIGN PATENT DOCUMENTS

JP    5-163488    6/1993
JP    2004-335851    11/2004
(Continued)

OTHER PUBLICATIONS

International Search Report and Written Opinion of PCT/JP2011/003547, mailing date is Sep. 20, 2011, together with English translation of ISR.

(Continued)

*Primary Examiner* — Hsien Ming Lee
(74) *Attorney, Agent, or Firm* — Greenblum & Bernstein P.L.C.

(57) ABSTRACT

A thin film transistor element includes a gate electrode, an insulating layer formed on the gate electrode, and partition walls formed on the insulating layer and defining a first aperture above the gate electrode. The thin film transistor element further includes, at a bottom portion of the first aperture, a source electrode and a drain electrode that are in alignment with each other with a gap therebetween, a liquid-philic layer, and a semiconductor layer that covers the source electrode, the drain electrode, and the liquid-philic layer as well as gaps therebetween. The liquid-philic layer has higher liquid philicity than the insulating layer, and in plan view of the bottom portion of the first aperture, a center of area of the liquid-philic layer is offset from a center of area of the bottom portion of the first aperture.

18 Claims, 12 Drawing Sheets

(51) Int. Cl.

| | | |
|---|---|---|
| *H01L 27/15* | (2006.01) | |
| *H01L 21/00* | (2006.01) | |
| *H01L 51/40* | (2006.01) | |
| *H01L 51/52* | (2006.01) | |
| *H01L 27/12* | (2006.01) | |
| *H01L 51/56* | (2006.01) | |
| *H01L 51/00* | (2006.01) | |
| *H01L 51/05* | (2006.01) | |

(52) U.S. Cl.
CPC ............ *H01L27/1214* (2013.01); *H01L 51/56* (2013.01); *H01L 51/0004* (2013.01); *H01L 51/0545* (2013.01); *H01L 51/0558* (2013.01)
USPC .................. 257/59; 257/72; 257/79; 257/81; 438/34; 438/48; 438/99; 438/149; 438/161

(56) References Cited

U.S. PATENT DOCUMENTS

| | | | |
|---|---|---|---|
| 2007/0109457 A1* | 5/2007 | Song et al. ...................... | 349/44 |
| 2007/0117298 A1 | 5/2007 | Fujimori et al. | |
| 2007/0166855 A1 | 7/2007 | Lee et al. | |
| 2009/0224664 A1 | 9/2009 | Yoshida et al. | |
| 2011/0254003 A1 | 10/2011 | Tsuzuki et al. | |

FOREIGN PATENT DOCUMENTS

| | | |
|---|---|---|
| JP | 2007-88471 | 4/2007 |
| JP | 2007-142305 | 6/2007 |
| JP | 2008-227141 | 9/2008 |
| JP | 2008-288313 | 11/2008 |
| JP | 2009-76791 | 4/2009 |
| JP | 2009-272523 | 11/2009 |
| JP | 2010-93093 | 4/2010 |
| WO | 2008/149498 | 12/2008 |
| WO | 2010/058662 | 5/2010 |
| WO | 2011/132215 | 10/2011 |
| WO | 2012/035281 | 3/2012 |

OTHER PUBLICATIONS

International Search Report and Written Opinion of PCT/JP2012/005995, mailing date is Dec. 4, 2012, together with English translation of ISR.

International Search Report and Written Opinion of PCT/JP2012/005999, mailing date is Dec. 11, 2012, together with English translation of ISR.

International Search Report and Written Opinion of PCT/JP2012/006007, mailing date is Dec. 4, 2012, together with English translation of ISR.

International Search Report and Written Opinion of PCT/JP2012/006000, mailing date is Dec. 11, 2012, together with English translation of ISR.

International Search Report and Written Opinion of PCT/JP2011/003549, mailing date is Sep. 20, 2011, together with English translation of ISR.

International Search Report and Written Opinion of PCT/JP2012/005996, mailing date is Dec. 11, 2012, together with English translation of ISR.

U.S. Appl. No. 14/059,559 to Yuko Okumoto et al., filed Oct. 22, 2013.

U.S. Appl. No. 13/968,549 to Yuko Okumoto et al., filed Aug. 16, 2013.

U.S. Appl. No. 14/061,057 to Yuko Okumoto et al., filed Oct. 23, 2013.

U.S. Appl. No. 13/968,556 to Yuko Okumoto et al., filed Aug. 16, 2013.

U.S. Appl. No. 13/968,571 to Yuko Okumoto et al., filed Aug. 16, 2013.

U.S. Appl. No. 13/968,559 to Yuko Okumoto et al., filed Aug. 16, 2013.

* cited by examiner

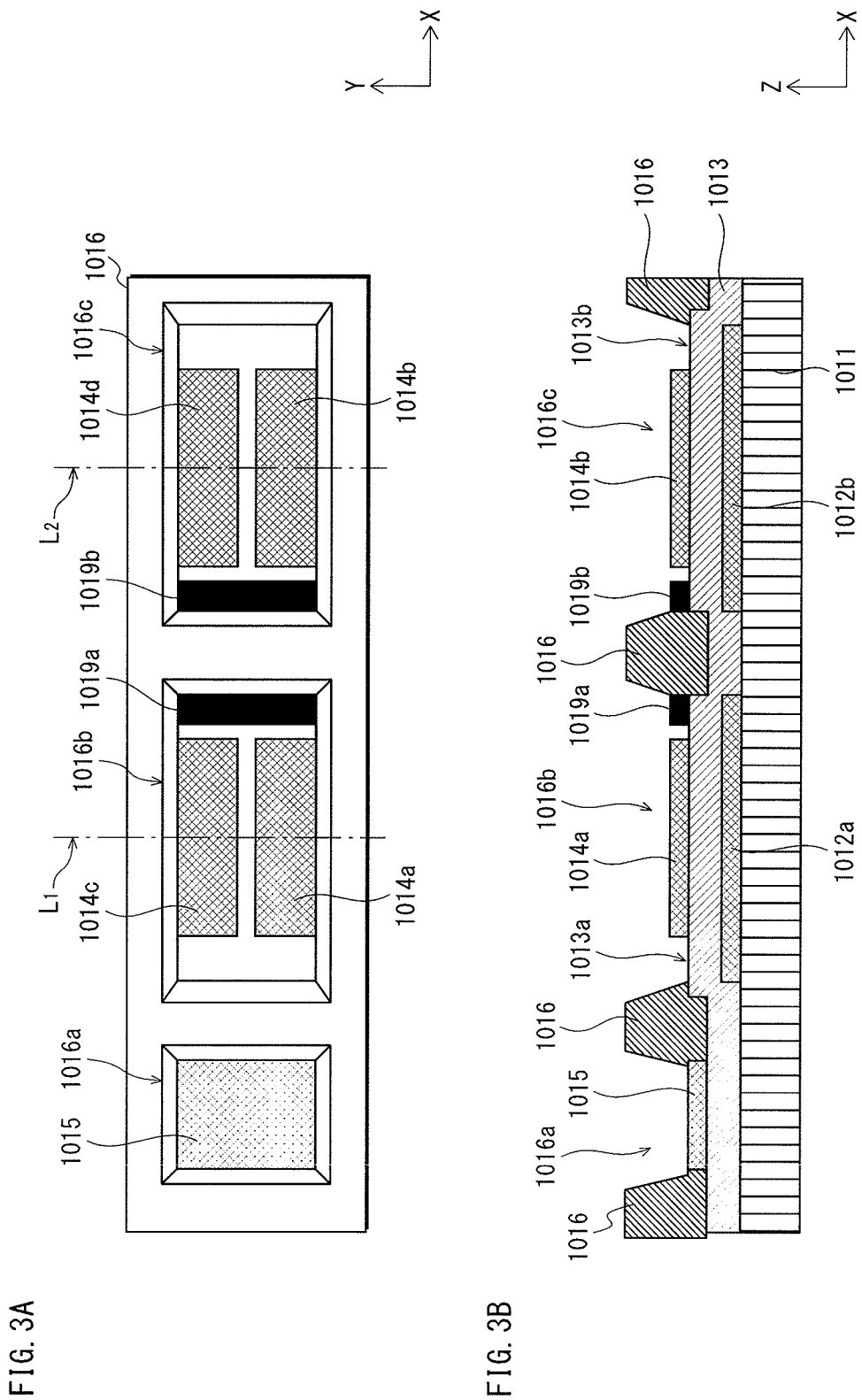

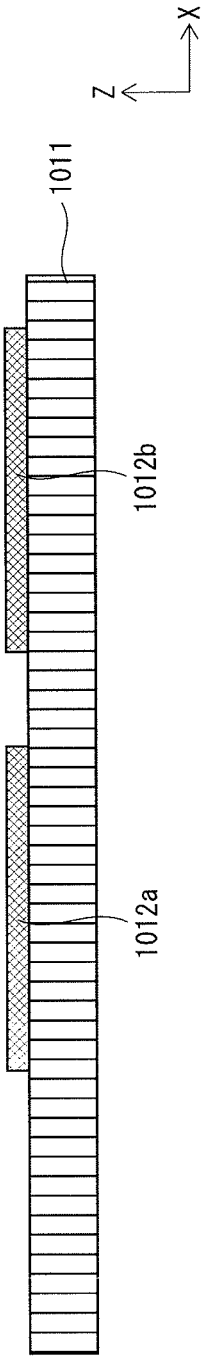
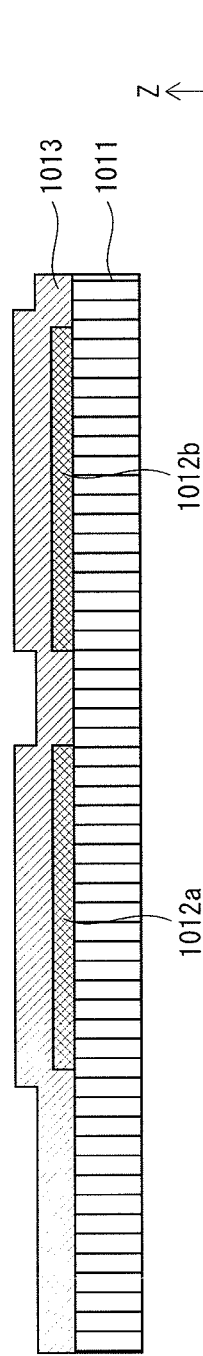
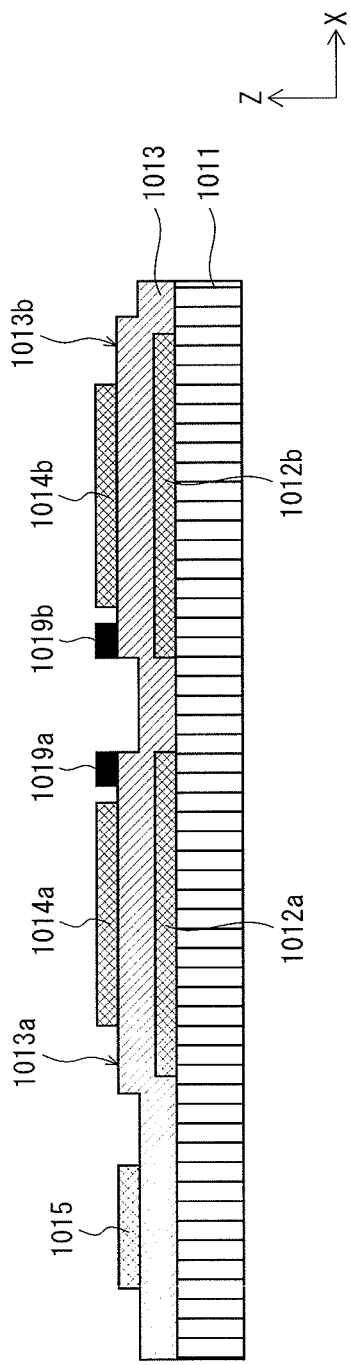
FIG. 5A
FIG. 5B
FIG. 5C

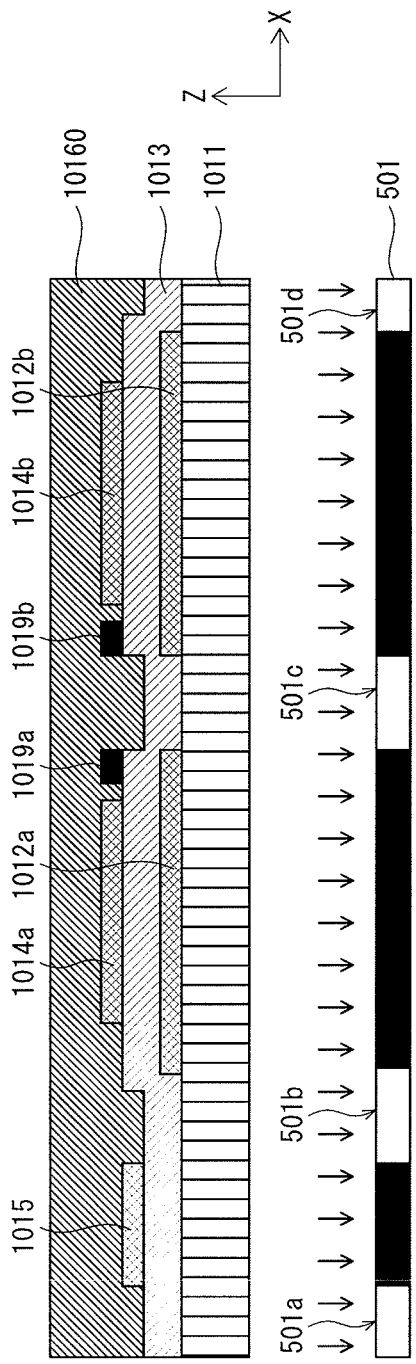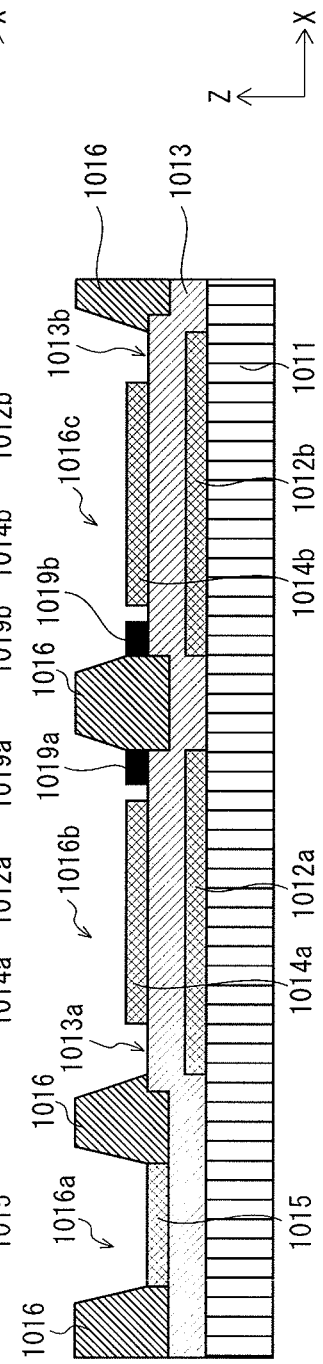

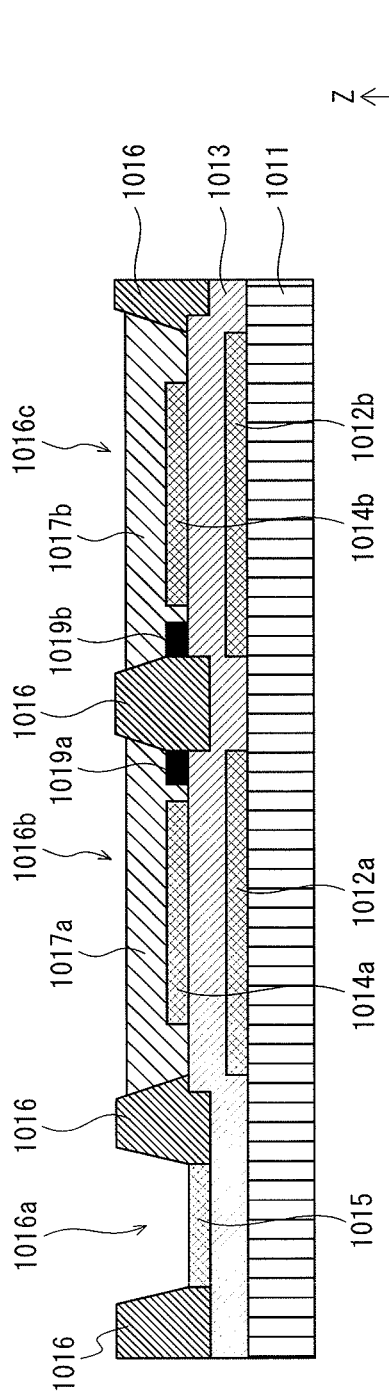

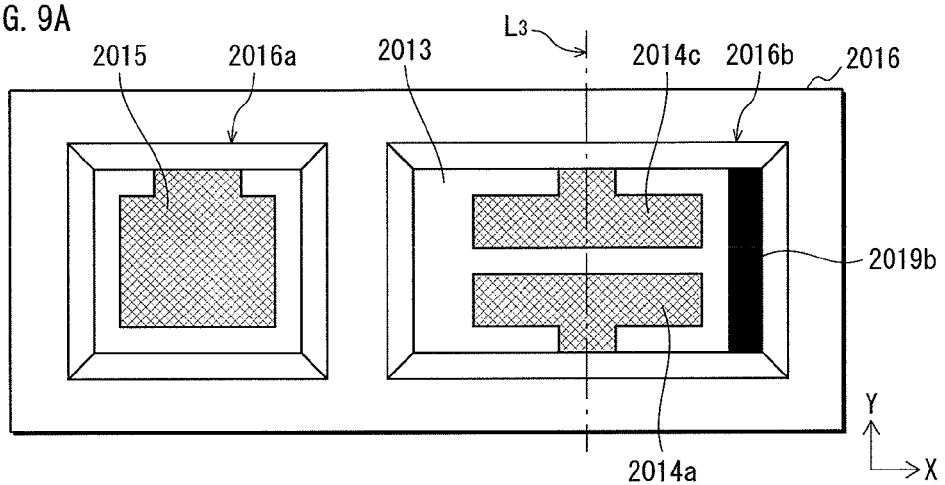
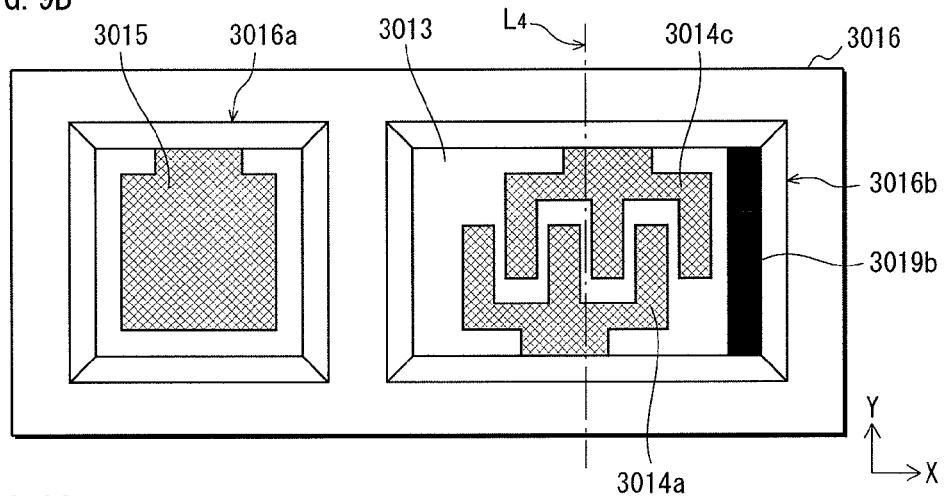
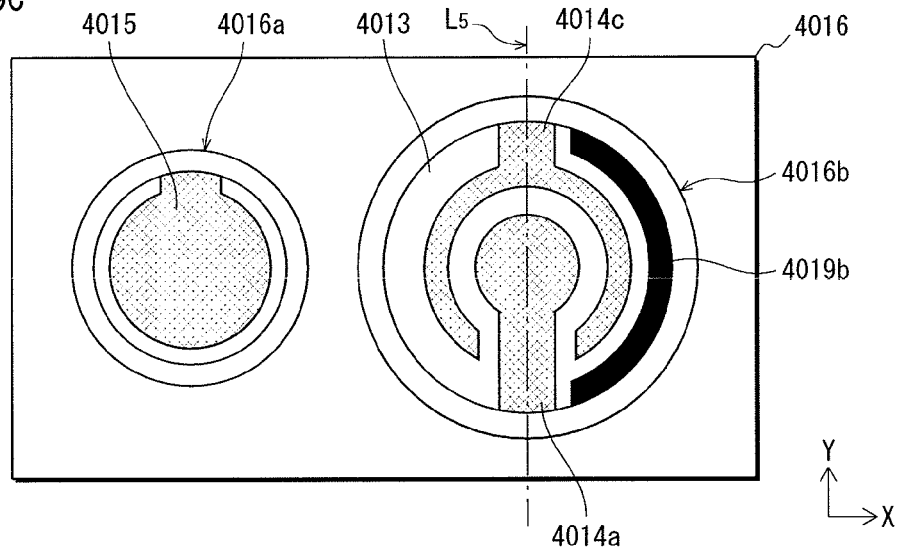

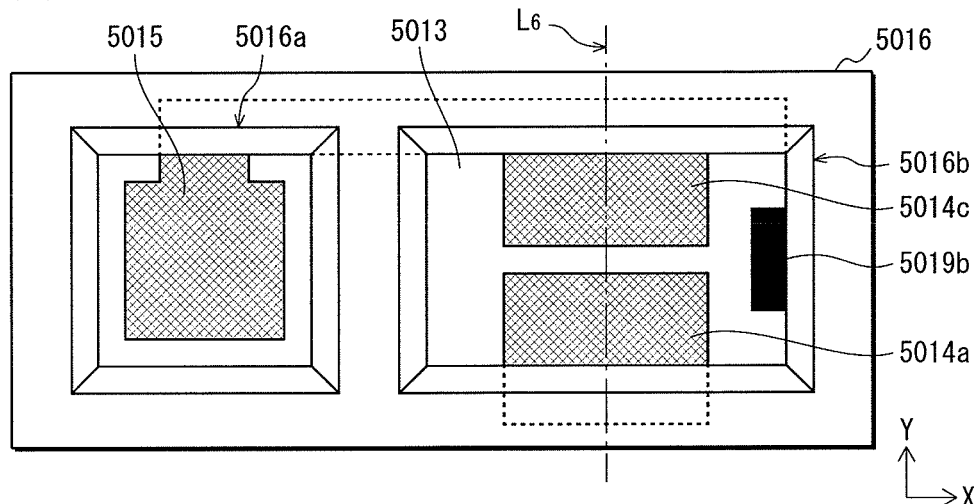
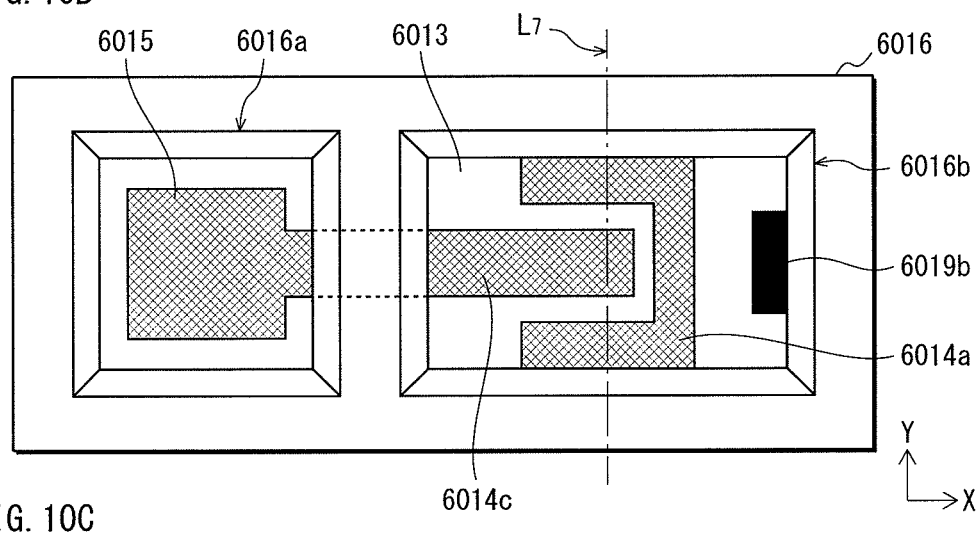
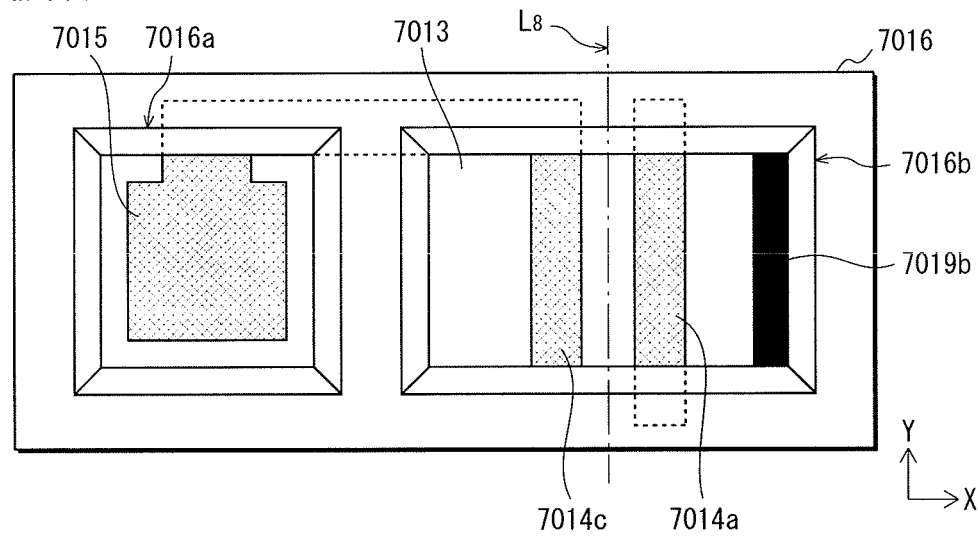

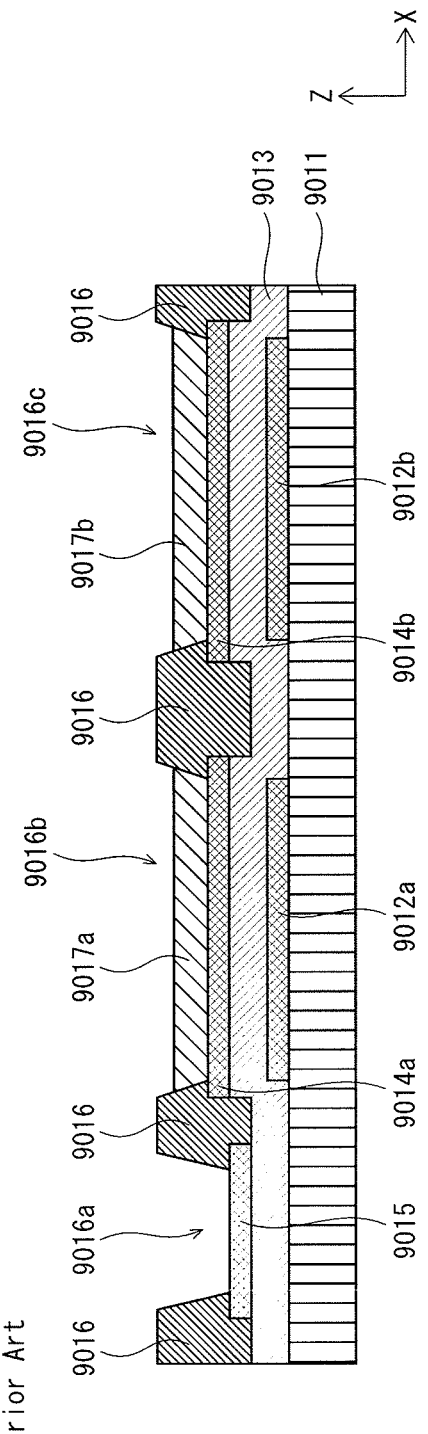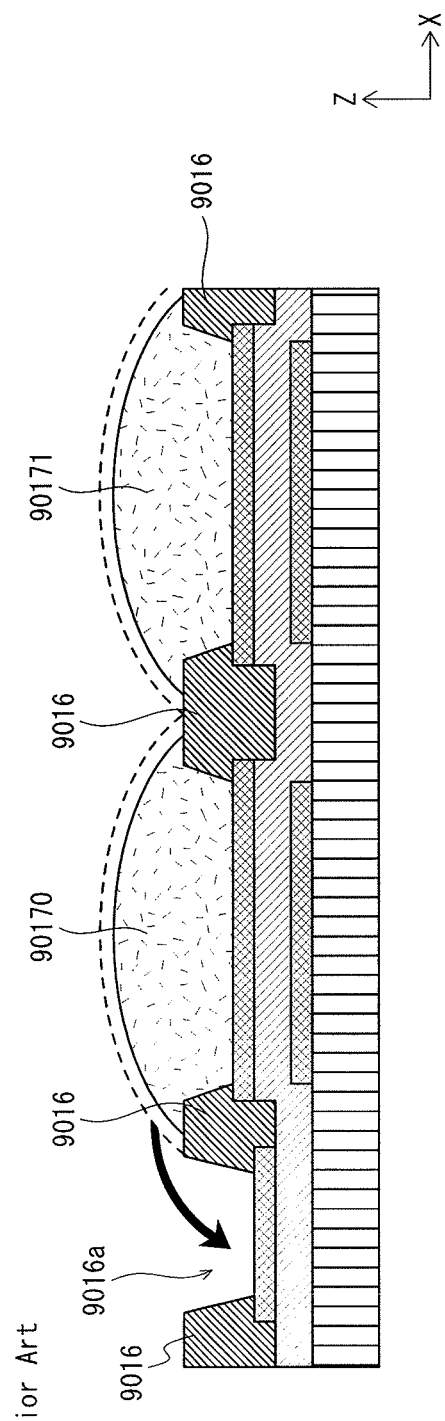
FIG. 12A Prior Art
FIG. 12B Prior Art

THIN-FILM TRANSISTOR ELEMENT AND METHOD FOR MANUFACTURING SAME, ORGANIC ELECTROLUMINESCENT DISPLAY ELEMENT, AND ORGANIC ELECTROLUMINESCENT DISPLAY DEVICE

CROSS REFERENCE TO RELATED APPLICATION

This is a continuation application of PCT Application No. PCT/JP2012/005996 filed Sep. 21, 2012, designating the United States of America, the disclosure of which, including the specification, drawings and claims, is incorporated herein by reference in its entirety.

TECHNICAL FIELD

The present disclosure relates to a thin film transistor element and a manufacturing method thereof, an organic EL display element, and an organic EL display device.

DESCRIPTION OF THE RELATED ART

In liquid crystal display panels and organic EL display panels, control of light emission is performed in units of subpixels. To make this possible, thin film transistor (TFT) elements are formed in liquid crystal display panels and organic EL display panels. In particular, development is in progress of thin film transistor elements including organic semiconductor layers.

As illustrated in FIG. 12A, a conventional TFT element includes, for instance: a substrate 9011; gate electrodes 9012a, 9012b; an insulating layer 9013; source electrodes 9014a, 9014b; drain electrodes (undepicted); and organic semiconductor layers 9017a, 9017b. The gate electrodes 9012a, 9012b, the insulating layer 9013, the source electrodes 9014a, 9014b, the drain electrodes, and the organic semiconductor layers 9017a, 9017b are formed by being layered one on top of another in the stated order on the substrate 9011. The organic semiconductor layers 9017a, 9017b are formed by applying organic semiconductor ink onto the insulating layer 9013 and by drying the applied organic semiconductor ink. The organic semiconductor layer 9017a is formed so as to fill the gap between the source electrode 9014a and the corresponding drain electrode and cover the source electrode 9014a and the corresponding drain electrode. Similarly, the organic semiconductor layer 9017b is formed so as to fill the gap between the source electrode 9014b and the corresponding drain electrode and cover the source electrode 9014b and the corresponding drain electrode.

In addition, as illustrated in FIG. 12A, partition walls 9016 are formed on the insulating layer 9013. The partition walls 9016 partition adjacent TFT elements from one another. The partition walls 9016 define a plurality of apertures, namely apertures 9016a through 9016c. The aperture 9016a has a bottom portion where a connection wire 9015 that is connected with a drain electrode remains exposed. Further, an organic semiconductor layer is not formed with respect to the aperture 9016a. The connection wire 9015 is an electrode to be connected to an electrode of a light-emitting element portion to be formed above the TFT element. On the other hand, the organic semiconductor layers 9017a, 9017b are formed with respect to the apertures 9016b, 9016c, respectively. Note that the organic semiconductor layers 9017a, 9017b are partitioned from one another.

As already discussed above, a TFT element is used in a liquid crystal display panel, an organic EL display panel, or the like, and controls light emission of a light-emitting element portion according to signals input to the gate electrodes 9012a, 9012b.

CITATION LIST

Patent Literature

[Patent Literature 1]
Japanese Patent Application Publication No. 2009-76791

SUMMARY

One problem in a conventional TFT element such as the one described above is the formation of an organic semiconductor layer with respect to an area of the TFT element where the formation of an organic semiconductor layer is undesirable (e.g., an inside of the aperture 9016a in the case illustrated in FIG. 12A. The formation of an organic semiconductor layer at such an area of the TFT element results in poor electrical connection between the TFT element and other elements (for instance, the above-described light-emitting element portion), and hence, is problematic. In specific, as illustrated in FIG. 12B, when respectively applying organic semiconductor ink 90170, 90171 with respect to the apertures 9016b, 9016c defined by the partition walls 9016, there are cases where the organic semiconductor ink 90170, 90171 overflows, flows out from the apertures 9016b, 9016c, and flows into the aperture 9016a. This results in the connection wire 9015, which is provided for electrical connection, being covered by an organic semiconductor layer.

Note that the same problems as described above can be expected to occur when an inorganic semiconductor layer is to be formed according to the application method.

It can be assumed that the above-described problem is likely to occur especially in a liquid crystal display panel, an organic EL display panel, etc. This is since there is a demand for realizing a liquid crystal display panel, an organic EL display panel, etc., with higher definition, which gives rise to a demand for downsizing subpixels therein. When the downsizing of subpixels is performed in response to such a demand, the distances between the above-described apertures are shortened, and the risk increases of ink overflowing from a given aperture and flowing into another aperture.

Non-limiting and exemplary embodiments provide a thin film transistor element having high quality and a manufacturing method thereof, an organic EL display element, and an organic EL display device. Such a high-quality thin film transistor element is realized by, upon formation of a semiconductor layer of the thin film transistor element, preventing formation of a semiconductor layer at an area where the formation of an organic semiconductor layer is undesirable and preventing the interfusion of ink applied with respect to adjacent apertures.

In one general aspect, the techniques disclosed here feature a thin film transistor element having the following characteristics.

The thin film transistor element comprises: a gate electrode; a source electrode and a drain electrode; an insulating layer; partition walls, a semiconductor layer; and a liquid-philic layer.

The source electrode and the drain electrode are disposed on the insulating layer with a gap therebetween.

The insulating layer is disposed on the gate electrode.

The partition walls are disposed on the insulating layer, have liquid-repellant surfaces, and define at least a first aperture and a second aperture.

The semiconductor layer is disposed on the source electrode and the drain electrode so as to cover the source electrode and the drain electrode and fill the gap between the source electrode and the drain electrode, and being in contact with the source electrode and the drain electrode.

The liquid-philic layer is disposed on the insulating layer, has higher liquid philicity than the insulating layer, and is separate from the source electrode and the drain electrode.

In the thin film transistor element, the first aperture surrounds at least a part of each of the source electrode, the drain electrode, and the liquid-philic layer, a bottom portion of the first aperture thus including a source electrode portion being a bottom portion of the source electrode, a drain electrode portion being a bottom portion of the drain electrode, and a liquid-philic layer portion being a bottom portion of the liquid-philic layer, the second aperture is located apart from the first aperture with a gap therebetween and the semiconductor layer is not formed within an area surrounded by the second aperture, and in plan view of the bottom portion of the first aperture, a center of area of the liquid-philic layer portion is offset from a center of area of the bottom portion of the first aperture in a first direction opposite a direction of the second aperture.

According to the thin film transistor element, the liquid-philic layer is disposed at the bottom portion of the first aperture, and the center of area of the liquid-philic layer is offset from the center of area of the bottom portion of the first aperture in the first direction. Due to this, when semiconductor ink for forming the semiconductor layer is applied with respect to the first aperture during the manufacture of the thin film transistor element, a surface of the semiconductor ink applied with respect to the first aperture exhibits a shape such that the height of the surface of the applied semiconductor ink at a side of the first aperture in the first direction is greater than the height of the surface of the applied semiconductor ink at a side of the first aperture in a direction opposite the first direction.

Due to this, in the manufacture of the thin film transistor element, semiconductor ink is prevented from overflowing and flowing out towards undesirable areas. As such, in the thin film transistor element, the formation of a semiconductor layer at only a desired area is realized. In addition, by preventing semiconductor ink from overflowing, the layer thickness of the semiconductor layer can be controlled with high precision.

Accordingly, the thin film transistor element ensures high quality since, upon formation of the semiconductor layer, the formation of a semiconductor layer at undesirable areas is prevented, and further, since it is possible to control the layer thickness of the semiconductor layer with high precision.

These general and specific aspects may be implemented by using an organic EL display element, an organic EL display device, and a method of manufacturing a thin film transistor element.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF THE DRAWINGS

FIG. 3A is a schematic plan view illustrating a partial structure of a TFT substrate 101, and FIG. 3B is a schematic cross-sectional view illustrating a partial structure of the TFT substrate 101.

FIGS. 5A through 5C are schematic process diagrams illustrating some procedures among procedures involved in the manufacturing of the TFT substrate 101.

FIGS. 6A through 6C are schematic process diagrams illustrating some procedures among procedures involved in the manufacturing of the TFT substrate 101.

FIGS. 8A and 8B are schematic process diagrams illustrating some procedures among procedures involved in the manufacturing of the TFT substrate 101.

FIG. 9A is a schematic plan view illustrating, in a structure of an organic EL display panel pertaining to embodiment 2, a partial structure of a TFT substrate, FIG. 9B is a schematic plan view illustrating, in a structure of an organic EL display panel pertaining to embodiment 3, a partial structure of a TFT substrate, and FIG. 9C is a schematic plan view illustrating, in a structure of an organic EL display panel pertaining to embodiment 4, a partial structure of a TFT substrate.

FIG. 10A is a schematic plan view illustrating, in a structure of an organic EL display panel pertaining to embodiment 5, a partial structure of a TFT substrate, FIG. 10B is a schematic plan view illustrating, in a structure of an organic EL display panel pertaining to embodiment 6, a partial structure of a TFT substrate, and FIG. 10C is a schematic plan view illustrating, in a structure of an organic EL display panel pertaining to embodiment 7, a partial structure of a TFT substrate.

FIG. 12A is a cross-sectional view illustrating, in a structure of an organic EL display device pertaining to conventional technology, a partial structure of a TFT substrate, and FIG. 12B is a cross-sectional view illustrating a procedure pertaining to application of organic semiconductor ink among procedures involved in the manufacturing of the TFT substrate pertaining to conventional technology.

DETAILED DESCRIPTION

Overview of Aspects of Present Invention

Figure 1:
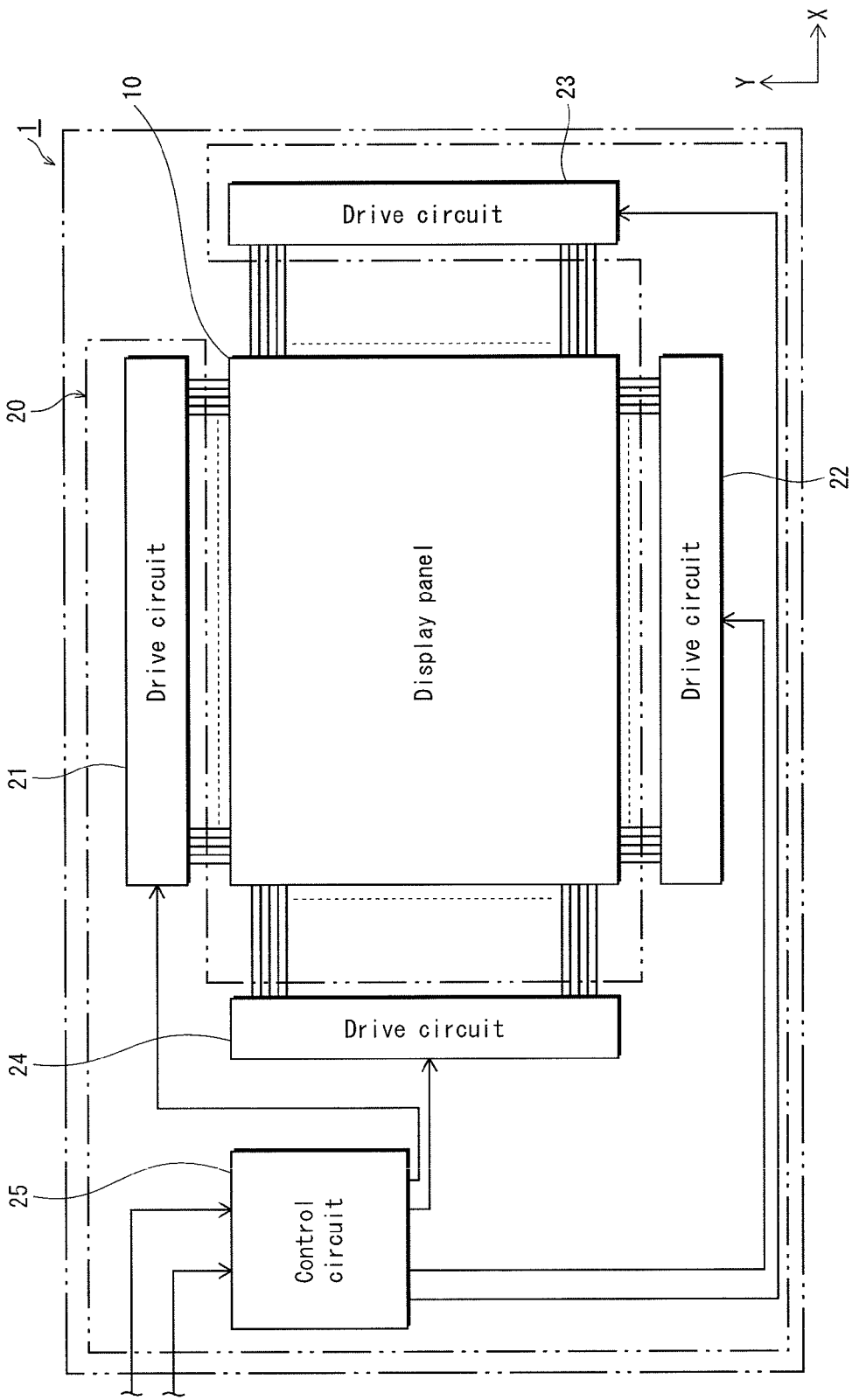
FIG. 1 is a schematic block diagram illustrating an overall structure of an organic EL display device 1 pertaining to embodiment 1.

One aspect of the present invention is a thin film transistor element comprising: a gate electrode; a source electrode and a drain electrode; an insulating layer; partition walls, a semiconductor layer; and a liquid-philic layer.

The source electrode and the drain electrode are disposed on the insulating layer with a gap therebetween.

The insulating layer is disposed on the gate electrode.

The partition walls are disposed on the insulating layer, have liquid-repellant surfaces, and define at least a first aperture and a second aperture.

The semiconductor layer is disposed on the source electrode and the drain electrode so as to cover the source electrode and the drain electrode and fill the gap between the source electrode and the drain electrode, and being in contact with the source electrode and the drain electrode.

The liquid-philic layer is disposed on the insulating layer, has higher liquid philicity than the insulating layer, and is separate from the source electrode and the drain electrode.

In the thin film transistor element pertaining to one aspect of the present invention, the first aperture surrounds at least a part of each of the source electrode, the drain electrode, and the liquid-philic layer, a bottom portion of the first aperture thus including a source electrode portion being a bottom portion of the source electrode, a drain electrode portion being a bottom portion of the drain electrode, and a liquid-philic layer portion being a bottom portion of the liquid-philic layer, the second aperture is located apart from the first aperture with a gap therebetween and the semiconductor layer is not formed within an area surrounded by the second aperture, and in plan view of the bottom portion of the first aperture, a center of area of the liquid-philic layer portion is offset from a center of area of the bottom portion of the first aperture in a first direction opposite a direction of the second aperture.

In other words, a liquid-philic layer, which commonly has high liquid philicity (wettability), is disposed so as to be offset in the first direction.

Note that, when denoting an area of the liquid-philic layer as A and a distance from a given point to a center of area of the liquid-philic layer as x, "a center of area of the liquid-philic layer" as discussed above, denoted as z, can be expressed as shown in Math. 1.

$$z=(A \times x)/A \qquad \text{[Math. 1]}$$

According to this structure, when semiconductor ink for forming the semiconductor layer is applied with respect to the first aperture during the manufacture of the thin film transistor element pertaining to one aspect of the present invention, a surface of the semiconductor ink applied with respect to the first aperture exhibits a shape such that the height of the surface of the applied semiconductor ink at a side of the first aperture in the first direction is greater than the height of the surface of the applied semiconductor ink at a side of the first aperture in a direction opposite the first direction. Due to this, in the manufacture of the thin film transistor element pertaining to one aspect of the present invention, organic semiconductor ink is prevented from overflowing and flowing out towards undesirable areas. As such, in the thin film transistor element pertaining to the present invention, the formation of an organic semiconductor layer at only a desired area is realized. In addition, by preventing organic semiconductor ink from overflowing and flowing out, the layer thickness of the organic semiconductor layer can be controlled with high precision.

Accordingly, the thin film transistor element pertaining to one aspect of the present invention ensures high quality since, upon formation of the semiconductor layer, the formation of a semiconductor layer at undesirable areas is prevented, and further, since it is possible to control the layer thickness of the semiconductor layer with high precision.

In the thin film transistor element pertaining to one aspect of the present invention, the bottom portion of the first aperture may include a first portion where the source electrode portion, the drain electrode portion, and the liquid-philic layer portion do not exist and thus, where the insulating layer is in direct contact with the semiconductor layer, the first portion being within an area of the bottom portion of the first aperture located in the direction of the second aperture. According to this structure, when semiconductor ink is applied with respect to the first aperture, the surface of the semiconductor ink applied with respect to the first aperture exhibits the above-described shape where the height of the surface of the applied semiconductor ink at a side of the first aperture in the first direction is greater than the height of the surface of the applied semiconductor ink at a side of the first aperture in a direction opposite the first direction with higher certainty.

In the thin film transistor element pertaining to one aspect of the present invention, the bottom portion of the first aperture may include a second portion where the source electrode portion, the drain electrode portion, and the liquid-philic layer portion do not exist and thus, where the insulating layer is in direct contact with the semiconductor layer, the second portion being within an area of the bottom portion of the first aperture located in the first direction, and in plan view of the bottom portion of the first aperture, an area of the first portion may be greater than an area of the second portion.

According to this structure where a portion where the insulating layer is in direct contact with the semiconductor layer is provided at each of the side of the bottom portion of the first aperture that is located in the first direction and the side of the bottom portion of the first aperture that is located in the direction opposite the first direction and where an area of the portion where the insulating layer is in direct contact with the semiconductor layer is greater at the side of the bottom portion of the first aperture that is located in the direction opposite the first direction than at the side of the bottom portion of the first aperture that is located in the first direction, when semiconductor ink is applied in the formation of the semiconductor layer, the semiconductor ink can be effectively prevented from overflowing and flowing out towards the direction opposite the first direction, whereby a thin film transistor element having high performance can be realized. That is, due to the liquid-philic layer being offset in the first direction, the semiconductor ink applied with respect to the first aperture is biased towards the first direction. Further, also since the area of the insulating layer remaining exposed at the bottom portion of the first aperture is greater at the side of the bottom portion that is located in the direction differing from the first direction that at the side of the bottom portion that is located in the first direction, the ink applied with respect to the first aperture is biased towards the first direction.

Accordingly, according to this structure, upon formation of the semiconductor layer, the flowing out of the semiconductor ink towards the direction opposite the first direction is prevented with higher certainty, and thus, a thin film transistor element having high quality can be realized.

In the thin film transistor element pertaining to one aspect of the present invention, the liquid-philic layer may be formed by using a same material as used for forming the source electrode and the drain electrode, and the liquid-philic layer may be located apart from each of the source electrode and the drain electrode. When forming the liquid-philic layer by using the same material used for forming the source electrode and the drain electrode as in the above-described structure, an increase in procedures during manufacture is prevented, and hence, an increase in manufacturing cost is prevented. Further, by forming the liquid-philic layer so as to be located apart from each of the source electrode and the drain electrode as in the above-described structure, the performance of the transistor element can be maintained.

In the thin film transistor element pertaining to one aspect of the present invention, in plan view of the bottom portion of the first aperture, a center of a total of areas of the source electrode portion and the drain electrode portion may coincide with the center of area of the bottom portion of the first aperture. According to this structure, the performance of the transistor element can be maintained at a high level.

In the thin film transistor element pertaining to one aspect of the present invention, in plan view of the bottom portion of the first aperture, a center of a total of areas of the source electrode portion, the drain electrode portion, and the liquid-philic layer portion may be offset from the center of area of the bottom portion of the first aperture in the first direction. According to this structure, when semiconductor ink for forming the semiconductor layer is applied with respect to the first aperture during the manufacture of the thin film transistor element pertaining to one aspect of the present invention, a surface of the semiconductor ink applied with respect to the first aperture exhibits a shape such that the height of the surface of the applied semiconductor ink at a side of the first aperture in the first direction is greater than the height of the surface of the applied semiconductor ink at a side of the first aperture in a direction opposite the first direction. Due to this, in the manufacture of the thin film transistor element pertaining to one aspect of the present invention, organic semiconductor ink is prevented from overflowing and flowing out towards undesirable areas.

Note that, when denoting: the area of the source electrode as $A_S$; a distance from a given point to the center of area of the source electrode as $x_S$; the area of the drain electrode as $A_D$; a distance from the given point to the center of area of the drain electrode as $X_D$, the area of the liquid-philic layer as $A_H$; and a distance from the given point to the center of area of the liquid-philic layer as $X_H$, "a center of a total of areas of the source electrode, the drain electrode, and the liquid-philic layer", denoted as z, can be expressed as shown in Math. 2.

$$z=(A_S \times x_S + A_D \times x_D + A_H \times x_H)/(A_S + A_D + A_H) \quad [\text{Math. 2}]$$

In the thin film transistor element pertaining to one aspect of the present invention, at the bottom portion of the first aperture, a side, in the first direction, of the liquid-philic layer portion may be in contact with a side surface portion of the partition walls facing the first aperture. The above-described effect can also be realized by specifically arranging the source electrode and the drain electrode in such a manner.

In the thin film transistor element pertaining to one aspect of the present invention, a liquid repellency of the surfaces of the partition walls may be greater than a liquid repellency of a surface of the insulating layer that is in contact with the semiconductor layer, and the liquid repellency of the surface of the insulating layer that is in contact with the semiconductor layer may be greater than a liquid repellency of a surface of each of the source electrode, the drain electrode, and the liquid-philic layer. According to this structure, when semiconductor ink is applied with respect to the first aperture, the surface of the semiconductor ink applied with respect to the first aperture exhibits the above-described shape where the height of the surface of the applied semiconductor ink at a side of the first aperture in the first direction is greater than the height of the surface of the applied semiconductor ink at a side of the first aperture in a direction opposite the first direction with higher certainty.

In the thin film transistor element pertaining to one aspect of the present invention, the semiconductor layer may be formed within an area surrounded by the first aperture, and thus, the area surrounded by the first aperture functions as a channel portion, and the area surrounded by the second aperture may not function as a channel portion. According to this structure, the flowing out of semiconductor ink towards the second aperture can be effectively prevented when the formation of a semiconductor layer inside the second aperture is undesirable.

As such, a thin film transistor element having high quality can be realized by employing this structure.

In the thin film transistor element pertaining to one aspect of the present invention, one of the source electrode and the drain electrode may extend into a bottom portion of the second aperture, or the bottom portion of the second aperture may include a wire formed for electrically connecting with one of the source electrode and the drain electrode. When the second aperture is used as a contact area for outputting signals from the thin film transistor element to the outside, the formation of a semiconductor layer with respect to the connection wire is to be prevented. Here, by employing the above-described structure, the flowing out of semiconductor ink towards the second aperture can be prevented with certainty, and thus, it is ensured that the second aperture maintains the function as the contact area.

As such, the thin film transistor element pertaining to one aspect of the present invention has high quality since the formation of a semiconductor layer with respect to the second aperture is prevented with certainty. In addition, by employing this structure, high yield is ensured in the manufacture of the thin film transistor element.

One aspect of the present invention is an organic EL display element comprising: the thin film transistor element pertaining to one aspect of the present invention; a planarizing film formed above the thin film transistor element and having a contact hole formed therein; a lower electrode formed so as to cover the planarizing film and a side surface of the planarizing film defining the contact hole, and electrically connected with one of the source electrode and the drain electrode; an upper electrode formed above the lower electrode; and an organic light-emitting layer interposed between the lower electrode and the upper electrode.

The organic EL display element pertaining to one aspect of the present invention, due to comprising the thin film transistor elements pertaining to one aspect of the present invention, has high overall quality.

One aspect of the present invention is an organic EL display element comprising: the thin film transistor element pertaining to one aspect of the present invention; a planarizing film formed above the thin film transistor element and having a contact hole formed therein; a lower electrode formed so as to cover the planarizing film and a side surface of the planarizing film defining the contact hole, and electrically connected with one of the source electrode and the drain electrode; an upper electrode formed above the lower electrode; and an organic light-emitting layer interposed between the lower electrode and the upper electrode, wherein the contact hole is in communication with the second aperture of the thin film transistor element.

When the contact hole is in communication with the second aperture of the thin film transistor element as in the above-described structure, a display element having high quality can be obtained by preventing the formation of a semiconductor layer above a connection wire in the second aperture with certainty.

One aspect of the present invention is an organic EL display device comprising any one of the organic EL display elements described above. According to this, the organic EL display device is also ensured to have high quality, and at the same time, to have high yield in the manufacture thereof.

One aspect of the present invention is a method of manufacturing a thin film transistor element, comprising:

forming a gate electrode on a substrate;
forming an insulating layer on the gate electrode;
forming a source electrode and a drain electrode, and a
   liquid-philic layer on the insulating layer, wherein the
   source electrode and the drain electrode are formed with
   a gap therebetween, and the liquid-philic layer is formed so as to be located apart from the source electrode and the drain electrode, the liquid-philic layer having higher liquid philicity than the insulating layer;

depositing a layer of photosensitive resist material such that, above the insulating layer, the layer of photosensitive resist material covers the source electrode and the drain electrode;

forming partition walls on the insulating layer by performing mask exposure and patterning of the layer of photosensitive resist material, the partition walls having liquid-repellant surfaces and defining at least a first aperture and a second aperture; and forming a semiconductor layer by applying semiconductor material with respect to the first aperture and drying the semiconductor material so applied, wherein the semiconductor layer is formed so as to be in contact with the source electrode and the drain electrode.

In the method for manufacturing a thin film transistor element pertaining to one aspect of the present invention, the first aperture surrounds at least a part of each of the source electrode, the drain electrode, and the liquid-philic layer, a bottom portion of the first aperture thus including a source electrode portion being a bottom portion of the source electrode, a drain electrode portion being a bottom portion of the drain electrode, and a liquid-philic layer portion being a bottom portion of the liquid-philic layer, the second aperture is located apart from the first aperture with a gap therebetween and the semiconductor layer is not formed within an area surrounded by the second aperture, and the partition walls are formed such that in plan view of the bottom portion of the first aperture, a center of area of the liquid-philic layer portion is offset from a center of area of the bottom portion of the first aperture in a first direction opposite a direction of the second aperture.

In the above-described method of manufacturing a thin film transistor element pertaining to one aspect of the present invention, the partition walls are formed such that, at the bottom portion of the first aperture, the liquid-philic layer is offset in the first direction. As such, when application of semiconductor material (ink) is performed in the sixth step, a surface of the semiconductor ink applied with respect to the first aperture exhibits a shape such that the height of the surface of the applied semiconductor ink at a side of the first aperture in the first direction is greater than the height of the surface of the applied semiconductor ink at a side of the first aperture in a direction opposite the first direction. As such, according to the method of manufacturing a thin film transistor element pertaining to one aspect of the present invention, in the manufacturing of a thin film transistor element, semiconductor ink can be prevented from flowing out towards undesirable areas (i.e., from the side of the first aperture in the direction opposite the first direction towards the outside of the first aperture). As such, in a thin film transistor element manufactured through the method of manufacturing a thin film transistor element pertaining to one aspect of the present invention, the formation of an organic semiconductor layer at only a desired area is realized. In addition, by preventing organic semiconductor ink from overflowing and flowing out, the layer thickness of the organic semiconductor layer can be controlled with high precision.

As such, according to the method of manufacturing a thin film transistor element pertaining to one aspect of the present invention, it is ensured that a thin film transistor element having high quality is manufactured since, upon formation of the semiconductor layer, the flowing out of the semiconductor ink towards undesirable areas is prevented with certainty.

In the method of manufacturing a thin film transistor element pertaining to one aspect of the present invention, the forming, on the insulating layer, of the source electrode, the drain electrode, and the liquid-philic layer may include substeps of: forming a metal layer on the insulating layer; and etching the metal layer so formed. By forming the liquid-philic layer by using the same material used for forming the source electrode and the drain electrode as in the above-described method, an increase in procedures during manufacture is prevented, and hence, the above-described effect can be realized while preventing an increase in manufacturing cost.

In the method of manufacturing a thin film transistor element pertaining to one aspect of the present invention, the partition walls may be formed such that the bottom portion of the first aperture includes a first portion where the source electrode portion, the drain electrode portion, and the liquid-philic layer portion do not exist and thus, where the insulating layer is to come in direct contact with the semiconductor layer, the first portion being within an area of the bottom portion of the first aperture located in the direction of the second aperture. According to this method, the surface of the semiconductor ink applied with respect to the first aperture exhibits the above-described shape where the height of the surface of the applied semiconductor ink at a side of the first aperture in the first direction is greater than the height of the surface of the applied semiconductor ink at a side of the first aperture in the direction opposite the first direction with higher certainty.

In the method of manufacturing a thin film transistor element pertaining to one aspect of the present invention, the partition walls may be formed such that the bottom portion of the first aperture includes a second portion where the source electrode portion, the drain electrode portion, and the liquid-philic layer portion do not exist and thus, where the insulating layer is to come in direct contact with the semiconductor layer, the second portion being within an area of the bottom portion of the first aperture located in the first direction, and in plan view of the bottom portion of the first aperture, an area of the first portion is greater than an area of the second portion. According to this method, the surface of the semiconductor ink applied with respect to the first aperture exhibits the above-described shape where the height of the surface of the applied semiconductor ink at a side of the first aperture in the first direction is greater than the height of the surface of the applied semiconductor ink at a side of the first aperture in the direction opposite the first direction with higher certainty.

In the method of manufacturing a thin film transistor element pertaining to one aspect of the present invention, the forming of the insulating layer, the forming of the source electrode, the drain electrodes, and the liquid-philic layer, the forming of the partition walls, and the forming of the semiconductor layer may be performed such that a liquid repellency of the surfaces of the partition walls is greater than a liquid repellency of a surface of the insulating layer that is to come in contact with the semiconductor layer, and the liquid repellency of the surface of the insulating layer is greater than a liquid repellency of a surface of each of the source electrode, the drain electrode, and the liquid-philic layer.

According to this method, the partition walls are formed such that, at the bottom portion of the first aperture, the liquid-philic layer is offset in the first direction, and further, in the second through sixth steps, the forming of the insulating layer, the forming of the source electrode, the drain electrodes, and the liquid-philic layer, and the forming of the partition walls are performed such that the liquid repellency of the surfaces of the partition walls is greater than the liquid repellency of the surface of the insulating layer that is to come in contact with the semiconductor layer, and the liquid repellency of the surface of the insulating layer is greater than the liquid repellency of the surface of each of the source electrode, the drain electrode, and the liquid-philic layer. As such, when application of semiconductor material (ink) is performed in the sixth step, a surface of the semiconductor ink applied with respect to the first aperture exhibits a shape such that the height of the surface of the applied semiconductor ink at a side of the first aperture in the first direction is greater than the height of the surface of the applied semiconductor ink at a side of the first aperture in a direction opposite the first direction.

As such, according to the method of manufacturing a thin film transistor element pertaining to one aspect of the present invention, in the manufacturing of a thin film transistor element, semiconductor ink can be prevented from flowing out towards undesirable areas (i.e., from the side of the first aperture in the direction opposite the first direction towards the outside of the first aperture). As such, in a thin film transistor element manufactured through the method of manufacturing a thin film transistor element pertaining to one aspect of the present invention, the formation of an organic semiconductor layer at only a desired area is realized. In addition, by preventing organic semiconductor ink from overflowing and flowing out, the layer thickness of the organic semiconductor layer can be controlled with high precision.

As such, according to the method of manufacturing a thin film transistor element pertaining to one aspect of the present invention, it is ensured that a thin film transistor element having high quality is manufactured since, upon formation of the semiconductor layer, the flowing out of the semiconductor ink towards undesirable areas is prevented with certainty.

Note that in the above, when a given element is "on" or "above" another element, the given element is not limited to being disposed in the absolutely vertical direction with respect to the other element. Instead, in the present disclosure, the terms "on" and "above" are used to indicate the relative positions of different elements, or more specifically, the relative positions of different elements along the direction in which such elements are layered. Further, in the present disclosure, the term "on" or "above" are each used to indicate not only one but both of a state where a gap exists between two elements and a state where the two elements are in close contact with each other.

In the following, explanation is provided of characteristics of various forms of implementation and the effects achieved thereby, with reference to several specific examples thereof. Further, note that although the following embodiments include description on fundamental characteristic features, the present disclosure is not to be construed as being limited to the description provided in the following embodiments other than such fundamental features.

Embodiment 1

1. Overall Structure of Organic EL Display Device 1

In the following, description is provided on a structure of an organic EL display device 1 pertaining to embodiment 1 of the present disclosure, with reference to FIG. 1.

As illustrated in FIG. 1, the organic EL display device 1 includes an organic EL display panel 10 and a drive control circuit portion 20 connected to the organic EL display panel 10.

The organic EL display panel 10 is a panel that makes use of electroluminescence of organic material. The organic EL display panel 10 is composed of a plurality of organic EL elements that are, for instance, arranged so as to form a matrix. The drive control circuit portion 20 includes four drive circuits, namely drive circuits 21 through 24, and a control circuit 25.

Note that, in the organic EL display device 1 pertaining to the present embodiment, the positional arrangement of the drive control circuit portion 20 with respect to the organic EL display panel 10 is not limited to that illustrated in FIG. 1.

2. Structure of Organic EL Display Panel 10

In the following, description is provided on a structure of the organic EL display panel 10, with reference to the schematic cross-sectional view of FIG. 2, and FIGS. 3A and 3B.

Figure 2:
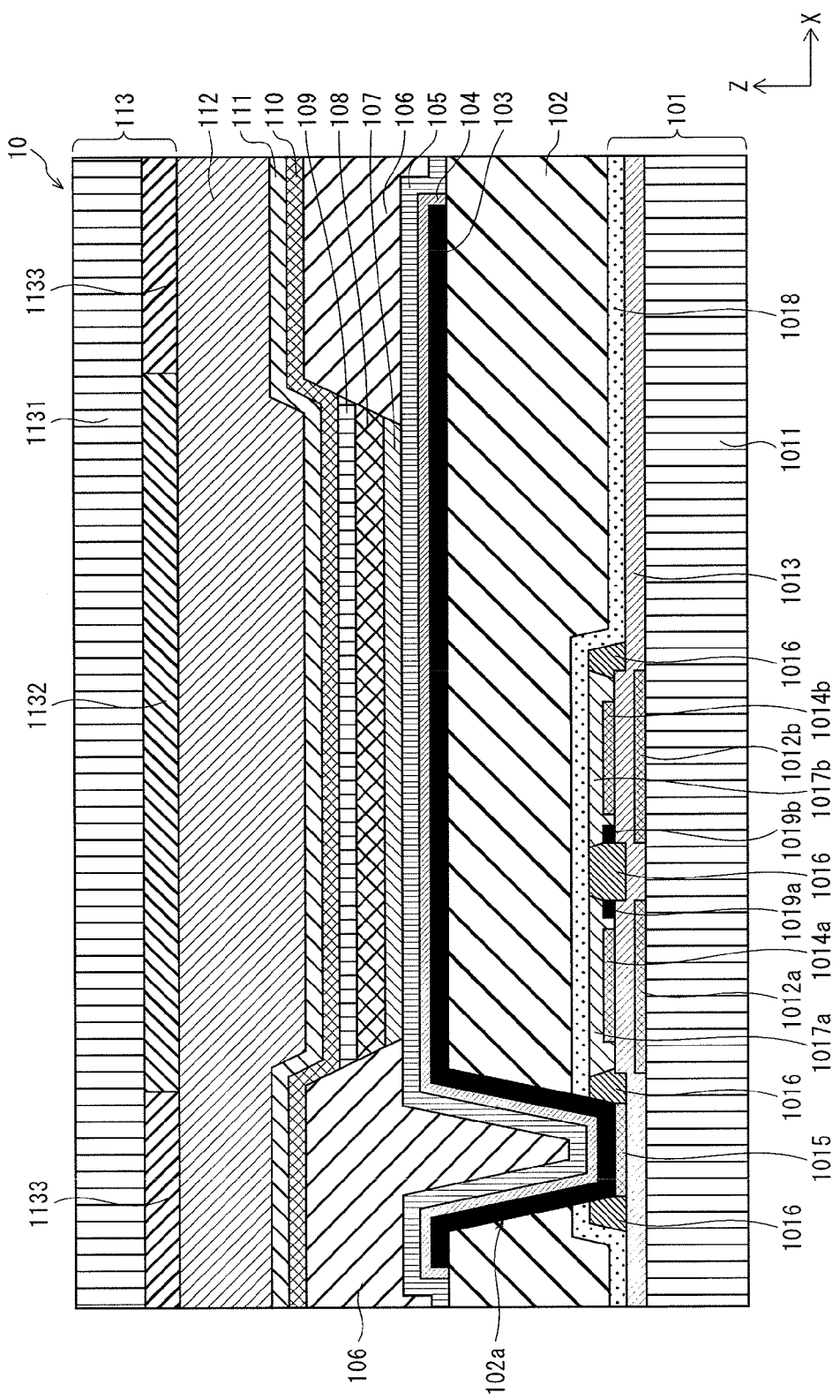
FIG. 2 is a schematic cross-sectional view illustrating a partial structure of an organic EL display panel 10.

As illustrated in FIG. 2, the organic EL display panel 10 includes a thin film transistor (TFT) substrate 101. The TFT substrate 101 has a structure where gate electrodes 1012a, 1012b are layered on a substrate 1011 with a gap between one another, and an insulating layer 1013 is layered so as to cover the substrate 1011 and the gate electrodes 1012a, 1012b. On the insulating layer 1013, source electrodes 1014a, 1014b, respectively corresponding to the gate electrodes 1012a, 1012b are disposed. Further, as illustrated in FIG. 3A, drain electrodes 1014c, 1014d are disposed on the insulating layer 1013. The drain electrodes 1014c, 1014d respectively correspond to the source electrodes 1014a, 1014b, and are each disposed so as to be located apart from a corresponding one of the source electrodes 1014a, 1014b in the Y axis direction with a gap therebetween.

As illustrated in FIG. 2, other than the source electrodes 1014a, 1014b and the drain electrodes 1014c, 1014d, liquid-philic layers 1019a, 1019b are also formed on the insulating layer 1013.

In addition, as illustrated in FIG. 2 and FIG. 3A, a connection wire 1015 is disposed on the insulating layer 1013 at the left side of the source electrode 1014a in the X axis direction, and such that there is a gap between the connection wire 1015 and the source electrode 1014a. The connection wire 1015 is formed by extending the source electrode 1014a or the drain electrode 1014c. Alternatively, the connection wire 1015 is electrically connected to the source electrode 1014a or the drain electrode 1014c.

Further, as illustrated in FIGS. 2 and 3A, partition walls 1016 are disposed on the insulating layer 1013. The partition walls 1016 surround (a) the connection wire 1015, (b) a combination of the source electrode 1014a and the drain electrode 1014c, and (c) a combination of the source electrode 1014b and the drain electrode 1014d, in such a manner that (a), (b), and (c) are separated from one another by being surrounded by the partition walls 1016. In other words, as illustrated in FIG. 3A, the partition walls 1016 define three apertures, namely an aperture 1016a, an aperture 1016b, and an aperture 1016c. The aperture 1016a at the far left side in the X axis direction has a bottom portion where the connection wire 1015 remains exposed. The aperture 1016a is not a channel portion and functions as a contact portion that contacts an anode. On the other hand, the aperture 1016b has a bottom portion where the source electrode 1014a and the drain electrode 1014c remain exposed, and the aperture 1016c has a bottom portion where the source electrode 1014b and the drain electrode 1014d remain exposed. The apertures 1016b and 1016c function as channel portions.

In addition, as illustrated in FIG. 3B, at each of the bottom portions of the apertures 1016b, 1016c, the corresponding one of the source electrodes 1014a, 1014b and the corresponding one of the drain electrodes 1014c, 1014d (refer to FIG. 3A for illustration) are not disposed so as to extend entirely across the bottom portion in the X axis direction. That is, at the bottom portion of the aperture 1016b, a portion of the insulating layer 1013 remains exposed at a left side of the bottom portion in the X axis direction (such portion hereinafter referred to as an exposed portion 1013a). Similarly, at the bottom portion of the aperture 1016c, a portion of the insulating layer 1013 remains exposed at a right side of the bottom portion in the X axis direction (such portion hereinafter referred to as an exposed portion 1013b).

Returning to FIG. 2, within the corresponding ones of the areas separately surrounded by the partition walls 1016, an organic semiconductor layer 1017a is layered onto the source electrode 1014a and the drain electrode 1014c, and an organic semiconductor layer 1017b is layered onto the source electrode 1014b and the drain electrode 1014d. More specifically, the organic semiconductor layer 1017a is formed so as to fill the gaps between the source electrode 1014a, the drain electrode 1014c, and the liquid-philic layer 1019a, and so as to cover the source electrode 1014a, the drain electrode 1014c, and the liquid-philic layer 1019a. The organic semiconductor layer 1017a so formed is in contact with the source electrode 1014a and the drain electrode 1014c. The organic semiconductor layer 1017b is formed in a similar manner and is in contact with the source electrode 1014b and the drain electrode 1014d. Further, the organic semiconductor layer 1017a and the organic semiconductor layer 1017b are partitioned from each other by the partition walls 1016.

Here, note that the organic semiconductor layer 1017a is in direct contact with the insulating layer 1013 at the exposed portion 1013a illustrated in FIG. 3B, without the source electrode 1014a or the drain electrode 1014c existing therebetween. Similarly, the organic semiconductor layer 1017b is in direct contact with the insulating layer 1013 at the exposed portion 1013b illustrated in FIG. 3B, without the source electrode 1014b or the drain electrode 1014d existing therebetween. Also refer to FIG. 2 for illustration of the above.

Further, as illustrated in FIG. 2, a passivation film 1018 is disposed so as to cover the organic semiconductor layer 1017a, the organic semiconductor layer 1017b, and the insulating layer 1013. However, it should be noted that the passivation film 1018 is not disposed above the area corresponding to the connection wire 1015, and therefore, an opening is formed at such an area.

The TFT substrate 101 of the organic EL display panel 10 pertaining to the present embodiment has a structure as described up to this point.

Next, as illustrated in FIG. 2, a planarizing film 102 covers the TFT substrate 101 from above. However, it should be noted that the planarizing film 102 does not cover the connection wire 1015, and a contact hole 102a is formed in the planarizing film 102 at an area above the connection wire 1015. The contact hole 102a is in communication with the aperture 1016a of the TFT substrate 101.

An anode 103, a light-transmissive conduction film 104, and a hole injection layer 105 are disposed in the stated order on a main surface of the planarizing film 102. Here, each of the anode 103, the light-transmissive conduction film 104, and the hole injection layer 105 is disposed not only on the planarizing film 102 but also along a side surface of the planarizing film 102 defining the contact hole 102a. The anode 103 is in contact with and electrically connected to the connection wire 1015.

Further, banks 106 are disposed on the hole injection layer 105. The banks 106 are disposed so as to surround an area above the hole injection layer 105 that corresponds to a light-emitting portion (i.e., a subpixel). In an opening formed at the above-described area by the banks 106, a hole transport layer 107, an organic light-emitting layer 108, and an electron transport layer 109 are disposed in the stated order.

On the electron transport layer 109 and on exposed surfaces of the banks 106, a cathode 110 and a sealing layer 111 are disposed in the stated order so as to cover the electron transport layer 109 and the exposed surfaces of the banks 106. Further, a color filter (CF) substrate 113 is arranged so as to face the sealing layer 111. The sealing layer 111 and the CF substrate 113 are joined together by an adhesion layer 112 filling a gap therebetween. The CF substrate 113 includes a substrate 1131, and a color filter 1132 and a black matrix 1133 disposed on a main surface of the substrate 1131. The main surface of the substrate 1131 is a surface of the substrate 1131 that is located lower in the Z axis direction.

3. Material Constituting Organic EL Display Panel 10

Each part of the organic EL display panel 10 may, for instance, be formed by using the materials as described in the following.

(i) Substrate 1011

The substrate 1011 may be, for instance: a glass substrate; a quartz substrate; a silicon substrate; a metal substrate composed of, for example, molybdenum sulfide, copper, zinc, aluminum, stainless steel, magnesium, iron, nickel, gold, or silver; a semiconductor substrate composed of, for example, gallium arsenide; or a plastic substrate.

Examples of material constituting the plastic substrate include thermoplastic resins and thermosetting resins. Examples thereof include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly(4-methylpentene-1), ionomers, acrylic-based resins, polymethyl methacrylater acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be a single layer substrate composed of one of the materials described above or a multilayer substrate having layers composed of two or more materials.

(ii) Gate Electrodes 1012a, 1012b

The gate electrodes 1012a, 1012b may be made of, for instance, any material having electrical conductivity.

Specific examples thereof include metals, such as chromium, aluminum, tantalum, molybdenum, niobium, copper, silver, gold, platinum, palladium, indium, nickel, and neodymium, and alloys thereof; conductive metal oxides, such as zinc oxide, tin oxide, indium oxide, and gallium oxide; conductive metal complex oxides, such as indium tin complex oxide (ITO), indium zinc complex oxide (IZO), aluminum zinc complex oxide (AZO), and gallium zinc complex oxide (GZO); conductive polymers, such as polyaniline, polypyrrole, polythiophene, and polyacetylene, and conductive polymers doped with acids, e.g., hydrochloric acid, sulfuric acid, and sulfonic acid, Lewis acids, e.g., phosphorus pentafluoride, arsenic pentafluoride, and iron chloride, halogen elements, e.g., iodine, and metals, e.g., sodium and potassium; and conductive composite materials containing carbon black and metal particles dispersed. Alternatively, polymer mixtures containing conductive particles, such as fine metal particles and graphite, may be used. These materials may be used alone or in combination.

(iii) Insulating Layer 1013

The insulating layer 1013 functions as a gate insulating layer. The insulating layer 1013 may be made, for instance, of any material having insulative properties. Examples of the material that can be used include organic insulating materials and inorganic insulating materials.

Examples of organic insulating materials include acrylic resins, phenolic resins, fluororesins, epoxy resins, imide resins, and novolac type resins.

Examples of inorganic insulating materials include: metal oxides, such as silicon oxide, aluminum oxide, tantalum oxide, zirconium oxide, cerium oxide, zinc oxide, and cobalt oxide; metal nitrides, such as silicon nitride, aluminum nitride, zirconium nitride, cerium nitride, zinc nitride, cobalt nitride, titanium nitride, and tantalum nitride; and metal complex oxides, such as barium strontium titanate and lead zirconate titanate. These may be used alone or in combination.

Further, the insulating layer 1013 may have a surface thereof processed by using a surface treatment agent (ODTS OTS HMDS βPTS) or the like.

(iv) Source Electrodes 1014a, 1014b, and Drain Electrodes 1014c, 1014d

The source electrodes 1014a, 1014b and the drain electrodes 1014c, 1014d can be formed by using the same materials as used for forming the gate electrodes 1012a, 1012b.

(v) Liquid-Philic Layers 1019a, 1019b

In the present embodiment, the liquid-philic layers 1019a, 1019b are formed by using the same material as used for forming the source electrodes 1014a, 1014b, the drain electrodes 1014c, 1014d, and the gate electrodes 1012a, 1012b. However, the material usable for forming the liquid-philic layers 1019a, 1019b is not limited to this, and any material having higher liquid philicity (higher wettability) than the insulating layer may be used.

(vi) Organic Semiconductor Layers 1017a, 1017b

The organic semiconductor layers 1017a, 1017b may be formed by using, for instance, any material that has semiconducting properties and is soluble to a solvent. Specific examples thereof include thiophene-based materials, such as poly(3-alkylthiophene), poly(3-hexylthiophene) (P3HT), poly(3-octylthiophene), poly(2,5-thienylene vinylene) (PTV), quarterthiophene (4T), sexithiophene (6T), octathiophene, 2,5-bis(5'-biphenyl-2'-thienyl)thiophene (BPT3), 2,5-[2,2'-(5,5'-diphenyl)dithienyl]thiophene, and [5,5'-bis(3-dodecyl-2-thienyl)-2,2'-bithiophene] (PQT-12); phenylene vinylene-based materials such as poly(paraphenylene vinylene) (PPV); fluorene-based materials such as poly(9,9-dioctylfluorene) (PFO); triallylamine-based polymers; acene-based materials, such as anthracene, tetracene, pentacene, and hexacene; benzene-based materials, such as 1,3,5-tris[(3-phenyl-6-trifluoromethyl)quinoxalin-2-yl]benzene (TPQ1) and 1,3,5-tris[{3-(4-tert-butylphenyl)-6-trisfluoromethyl}quinoxalin-2-yl]benzene (TPQ2); phthalocyanine-based materials, such as phthalocyanine, copper phthalocyanine (CuPc), iron phthalocyanine, and perfluorophthalocyanine; organometallic materials, such as tris(8-hydroxyquinoline) aluminum (Alq3) and fac-tris(2-phenylpyridine) iridium (Ir(ppy)3); C60; polymers, such as, oxadiazole-based polymers, triazole-based polymers, carbazole-based polymers, and fluorene-based polymers; poly(9,9-dioctylfluorene-co-bis-N,N'-(4-methoxyphenyl)-bis-N,N'-phenyl-1,4-phenylenediamine) (PFMO); poly(9,9-dioctylfluorene-co-benzothiadiazole) (BT); fluorene-triallylamine copolymers; and copolymers of fluorene and poly(9,9-dioctylfluorene-co-dithiophene) (F8T2). These materials may be alone or in combination.

Alternatively, the organic semiconductor layers 1017a, 1017b may be formed by using an inorganic material that is soluble in a solvent.

(vii) Passivation Film 1018

The passivation film 1018 may be formed by using, for instance, a water soluble resin such as polyvinyl alcohol (PVA), or a fluororesin.

(viii) Planarizing Film 102

The planarizing film 102 is formed by using, for instance, an organic compound such as polyimide, polyamide, and acrylic resin material.

(ix) Anode 103

The anode 103 is made of a metal material containing silver (Ag) or aluminum (Al). Further, in a top-emission type display panel such as the organic EL display panel 10 pertaining to the present embodiment, it is desirable that a surface portion of the anode 103 have high reflectivity.

(x) Light-Transmissive Conduction Film 104

The light-transmissive conduction film 104 is formed by using, for instance, Indium Tin Oxide (ITO), Indium Zinc Oxide (IZO), or the like.

(xi) Hole Injection Layer 105

The hole injection layer 105 is a layer made of, for instance, an oxide of a metal such as silver (Ag), molybdenum (Mo), chromium (Cr), vanadium (V), tungsten (W), nickel (Ni), and iridium (Ir), or a conductive polymer material such as PEDOT (an amalgam of polythiophene and polystyrene sulfonic acid). The hole injection layer 105 in the organic EL display panel 10 pertaining to the present embodiment as illustrated in FIG. 2 is assumed to be made of a metal oxide. In such a case, the hole injection layer 105 is provided with a function of assisting hole generation and injecting holes into the organic light-emitting layer 108 with a higher level of stability, compared to when the hole injection layer 105 is made of a conductive polymer material such as PEDOT. As such, the hole injection layer 105, when made of a metal oxide, has a higher work function than the hole injection layer 105, when made of a conductive polymer material.

Here, a case where the hole injection layer 105 is made of an oxide of a transition metal is considered. In such a case, a plurality of levels can be occupied since there are a plurality of oxidation numbers. This makes hole injection easy and allows for reduction of driving voltage. It is particularly desirable to form the hole injection layer 105 by using tungsten oxide ($WO_x$) since the hole injection layer 105 can be provided with the function of stably injecting holes and assisting the generation of holes.

(xii) Banks 106

The banks 106 are formed by using an organic material such as resin and have insulative properties. Example of organic material usable for forming the banks 106 include acrylic resins, polyimide resins, and novolac type phenolic resin. In addition, it is desirable that the banks 106 have organic solvent resistance. Further, since the banks 106 may undergo processes such as etching, baking, etc. when being formed, it is desirable that the banks 106 be formed from highly resistant material that will not change excessively in shape or quality during such processes. In addition, to provide the banks 106 with liquid repellency, the surfaces thereof can be fluoridated.

This is since, if a liquid-philic material is used to form the banks 106, the difference in liquid philicity/liquid repellency between the surfaces of the banks 106 and the surface of organic light-emitting layer 108 becomes small, and it thus becomes difficult to keep ink including an organic substance for forming the organic light-emitting layer 108 to be selectively held within the apertures defined by the banks 106.

In addition, the banks 106 need not be formed so as to have a single-layer structure as shown in FIG. 2. That is, the banks 106 may be alternatively formed so as to have a structure including two or more layers. In such a case, the above materials may be combined for each layer, or layers may alternate between inorganic and organic material.

(xiii) Hole Transport Layer 107

The hole transport layer 107 is formed by using a high-molecular compound not containing a hydrophilic group. For instance, the hole transport layer 107 may be formed by using a high-molecular compound such as polyfluorene or a derivative thereof, and polyallylamine or a derivative thereof, but not containing a hydrophilic group.

(xiv) Organic Light-Emitting Layer 108

The organic light-emitting layer 108 has a function of emitting light when an excitation state is produced by the recombination of holes and electrons injected thereto. It is desirable that material used to form the organic light-emitting layer 108 is a light emitting-organic material, a film of which can be formed by wet printing.

Specifically, it is desirable that the organic light-emitting layer 108 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(xv) Electron Transport Layer 109

The electron transport layer 110 has a function of transporting electrons injected through the cathode 111 to the organic light-emitting layer 108, and is formed by using, for instance, an oxadiazole derivative (OXD), a triazole derivative (TAZ), a phenanthroline derivative (BCP, Bphen), or the like.

(xvi) Cathode 110

The cathode 110 is formed by using, for instance, Indium Tin Oxide (ITO), Indium Zinc Oxide (IZO), or the like. Further, in a top-emission type display panel such as the organic EL display panel 10 pertaining to the present embodiment, it is desirable that the cathode 110 be formed by using light-transmissive material. When forming the cathode 111 by using light-transmissive material as described above, it is desirable that the cathode 111 be provided with light-transmissivity of 80% or greater.

In addition to the materials presented above, the following materials may be used to form the cathode 110. That is, the cathode 110 may be formed, for instance, as a layer including an alkali metal, a layer including an alkali earth metal, or a layer including an alkali earth metal halide. Alternatively, the cathode 110 may be formed as a laminate including one of the above-described layers and a layer including Ag laminated in the stated order. When the cathode 110 is formed as a laminate as described above, the layer including Ag may be formed with Ag alone, or with an alloy of Ag. Further, in order to enhance the efficiency with which light is guided out from the organic EL display panel 10, a highly light-transmissive, refraction index adjustment layer may be provided above the layer including Ag.

(xvii) Sealing Layer 111

The sealing layer 111 has a function of preventing organic layers such as the organic light-emitting layer 108 from being exposed to water and/or air and is formed by using, for example, material such as silicon nitride (SiN) and silicon oxynitride (SiON). In addition, a sealing resin layer made of a resin material such as acrylic resin and silicone resin may be further disposed above the sealing layer, which is formed by using material such as silicon nitride (SiN) and silicon oxynitride (SiON) as described above.

Further, in a top-emission type display panel such as the organic EL display panel 10 pertaining to the present embodiment, it is desirable that the sealing layer 111 be formed by using light-transmissive material.

4. Arrangement of Source Electrodes 1014a, 1014b, Drain Electrodes 1014c, 1014d, and Liquid-Philic Layers 1019a, 1019b in TFT Substrate 101

In the following, description is provided on a positional arrangement of the source electrodes 1014a, 1014b, the drain electrodes 1014c, 1014d, and the liquid-philic layers 1019a, 1019b in the TFT substrate 101, with reference to FIGS. 3A and 3B.

As illustrated in FIGS. 3A and 3B, at the bottom portion of the aperture 1016b defined by the partition walls 1016, the source electrode 1014a and the drain electrode 1014c are arranged such that centers, in the X axis direction, of the source electrode 1014a and the drain electrode 1014c coincide with a line $L_1$ passing through a center of area of the bottom portion of the aperture 1016b in the X axis direction. Similarly, at the bottom portion of the aperture 1016c defined by the partition walls 1016, the source electrode 1014b and the drain electrode 1014d are arranged such that centers, in the X axis direction, of the source electrode 1014b and the drain electrode 1014d coincide with a line $L_2$ passing through a center of area of the bottom portion of the aperture 1016b in the X axis direction. Further, at the bottom portion of the aperture 1016b, both sides in the X axis direction of each of the source electrode 1014a and the drain electrode 1014c are located apart from the partition walls 1016, and similarly, at the bottom portion of the aperture 1016c, both sides in the X axis direction of each of the source electrode 1014b and the drain electrode 1014d are located apart from the partition walls 1016.

Further, as illustrated in FIG. 3A, at the bottom portion of the aperture 1016b, the liquid-philic layer 1019a is arranged to be offset from the line $L_1$ passing through the center of area of the bottom portion in the X axis direction, and at the bottom portion of the aperture 1016c, the liquid-philic layer 1019b is arranged to be offset from the line $L_2$ passing through the center of area of the bottom portion in the X axis direction. More specifically, at the bottom portion of the aperture 1016b, the liquid-philic layer 1019a is offset in the right direction along the X axis with respect to the line $L_1$, and similarly, at the bottom portion of the aperture 1016c, the liquid-philic layer 1019b is offset in the left direction along the X axis with respect to the line $L_2$.

As illustrated in FIG. 3B, the liquid-philic layer 1019a is located apart from each of the source electrode 1014a and the drain electrode 1014c, and is disposed so as to be in contact with a bottom end of a side surface portion of the partition walls 1016. Similarly, as illustrated in FIG. 3B, the liquid-philic layer 1019b is located apart from each of the source electrode 1014b and the drain electrode 1014d, and is disposed so as to be in contact with a bottom end of a side surface portion of the partition walls 1016.

Thus, at the bottom portion of the aperture 1016b, a center of a total of areas of the source electrode 1014a, the drain electrode 1014c, and the liquid-philic layer 1019a is offset in the right direction along the X axis from the line $L_1$ passing through the center of area of the bottom portion in the X axis direction. Similarly, at the bottom portion of the aperture 1016c, a center of a total of areas of the source electrode 1014b, the drain electrode 1014d, and the liquid-philic layer 1019b is offset in the left direction along the X axis from the line $L_2$ passing through the center of area of the bottom portion in the X axis direction.

Note that each of "a center of a total of areas of the source electrode 1014a, the drain electrode 1014c, and the liquid-philic layer 1019a" and "a center of a total of areas of the source electrode 1014b, the drain electrode 1014d, and the liquid-philic layer 1019b" as mentioned above can be calculated according to Math. 2 above.

In addition, as illustrated in FIG. 3B, at a point when the organic semiconductor layer 1017a has not yet been formed, at the bottom portion of the aperture 1016b, the portion of the insulating layer 1013 remaining exposed (i.e., the exposed portion 1013a) occupies a greater area in the left side of the bottom portion of the aperture 1016b in the X axis direction compared to in the right side. Similarly, at a point when the organic semiconductor layer 1017b has not yet been formed, at the bottom portion of the aperture 1016c, the portion of the insulating layer 1013 remaining exposed (i.e., the exposed portion 1013b) occupies a greater area in the right side of the bottom portion of the aperture 1016c in the X axis direction compared to in the left side.

5. Method of Manufacturing Organic Display Device 1

In the following, description is provided on a method of manufacturing the organic EL display device 1, and in particular, a method of manufacturing the organic EL display panel 10, with reference to FIG. 2 and FIGS. 4A and 4B.

(i) Overview of Method of Manufacturing Organic EL Display Panel 10

Figure 4A:
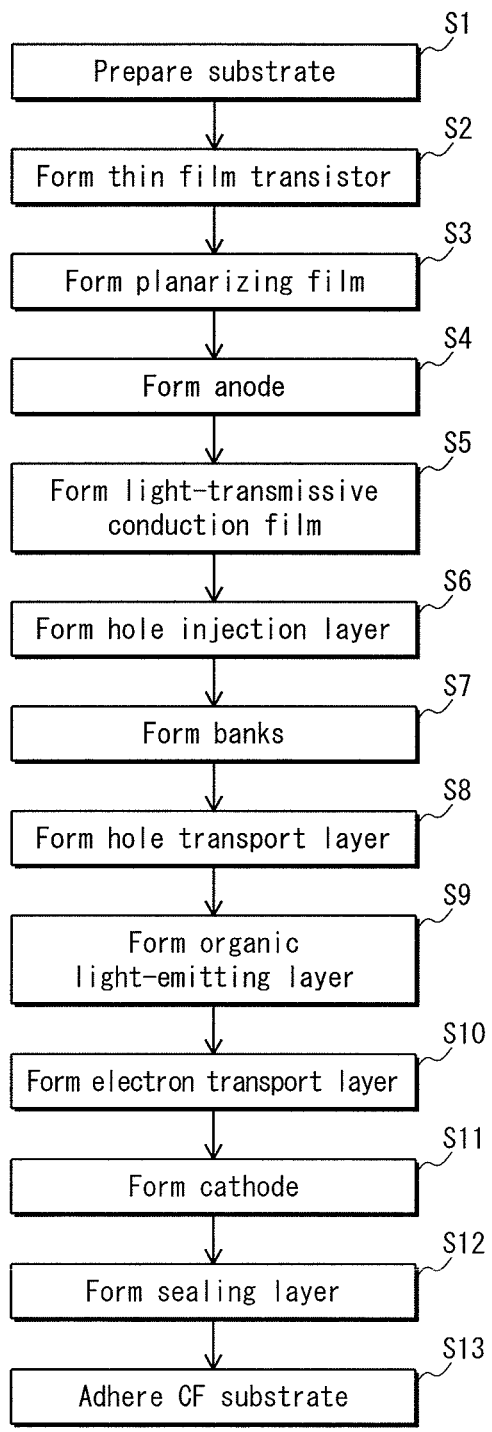
FIG. 4A is a process flow diagram providing an overview of a method of manufacturing the organic EL display panel 10.

First, as illustrated in FIG. 2 and FIG. 4A, the substrate 1011 is prepared (Step S1). The substrate 1011 serves as a base of the TFT substrate 101. Then, the TFT substrate 101 is formed by forming a thin film transistor (TFT) element on the substrate 1011 (Step S2).

Then, as illustrated in FIG. 2 and FIG. 4A, the planarizing film 102, which is made of insulative material, is formed on the TFT substrate 101 (Step S3). As illustrated in FIG. 2, the planarizing film 102 has the contact hole 102a formed therein at an area above the connection wire 1015 in the TFT substrate 101. Further, the planarizing film 102 is formed such that upper surfaces in the Z axis direction of portions thereof other than the contact hole 102a are substantially planar.

Then, the anode 103 is formed on the planarizing film 102 (Step S4). As illustrated in FIG. 2, the anode 103 in the organic EL display panel 10 is formed so as to be partitioned in units of light emission (i.e., in units of subpixels). Further, the anode 103 is formed so as to have a portion that is connected to the connection wire 1015 of the TFT substrate 101 by being formed along the side surface of the planarizing film 102 defining the contact hole 102a.

Here, note that the anode 103 can be formed, for instance, by first forming a metal film according to the sputtering method, the vacuum vapor deposition method, or the like, and then etching the metal film so formed to obtain subpixel units.

Then, the light-transmissive conduction film 104 is formed so as to cover an upper surface of the anode 103 (Step S5). As illustrated in FIG. 2, the light-transmissive conduction film 104 covers not only the upper surface of the anode 103 but also surfaces of lateral edges of the anode 103. Further, the light-transmissive conduction film 104 also covers the upper surface of the anode 103 within the contact hole 102a. Note that the light-transmissive conduction film 104 can also be formed, for instance, by first forming a film according to the sputtering method, the vacuum vapor deposition method, or the like, and then etching the film so formed to obtain subpixel units.

Then, the hole injection layer 105 is formed on the light-transmissive conduction film 104 (Step S6). Note that, although the hole injection layer 105 is formed so as to cover the entire light-transmissive conduction film 104 in FIG. 2, the hole injection layer 105 may alternatively be formed so as to be partitioned into subpixel units.

Further, when forming the hole injection layer 105 by using a metal oxide (e.g., tungsten oxide), the formation of the metal oxide film can be performed according to specific film forming conditions. For instance, the metal oxide film can be formed under film forming conditions such that: (i) a gas including argon gas and oxygen gas is used as a sputtering gas in a chamber of a sputtering device for forming the metal oxide film; (ii) a total pressure of the sputtering gas is higher than 2.7 Pa and lower than or equal to 7.0 Pa; (iii) a partial pressure of the oxygen gas in the sputtering gas is at least 50% and at most 70%; and (iv) an input power density per unit area of the sputtering target is at least 1.0 W/cm$^2$ and at most 2.8 W/cm$^2$.

Then, the banks 106 defining subpixels of the organic EL display panel 10 are formed (Step S7). As illustrated in FIG. 2, the banks 106 are formed so as to be layered onto the hole injection layer 105.

In specific, the banks 106 are formed by first forming a layer of material for forming the banks 106 (hereinafter referred to as a "material layer") on the hole injection layer 105. The material layer is formed, for instance, by using a material including a photosensitive resin component and a fluorine component such as acrylic resin, polyimide resin, and novolac-type phenolic resin, and according to the spin coating method, or the like. Note that, in the present embodiment, a negative photosensitive material manufactured by Zeon Corporation (product code: ZPN1168), which is one example of a photosensitive resin material, can be used for forming the material layer. Subsequently, by patterning the material layer so formed, apertures corresponding to the subpixels of the organic EL display panel 10 are formed. The forming of the apertures can be performed by disposing a mask onto the surface of the material layer, performing exposure from over the mask, and finally performing developing.

Then, in each concavity on the hole injection layer 105 defined by the banks 106, the hole transport layer 107, the organic light-emitting layer 108, and the electron transport layer 109 are formed in the stated order so as to be layered one on top of another (Steps S8 through S10).

The hole transport layer 107 is formed by first forming, according to the printing method, a film made of an organic compound for forming the hole transport layer 107, and then sintering the film so formed. The organic light-emitting layer 108 is similarly formed by first forming a film according to the printing method, and then sintering the film so formed.

Then, the cathode 110 and the sealing layer 111 are layered onto the electron transport layer 109 in the stated order (Steps S11 and S12). As illustrated in FIG. 2, the cathode 110 and the sealing layer 111 are formed so as to cover the layers therebelow entirely, including top surfaces of the banks 106.

Then, an adhesive resin material for forming the adhesion layer 112 is applied onto the sealing layer 111, and a color filter (CF) panel having been prepared in advance is adhered onto the sealing layer 111 via the adhesive layer 112 (Step S13). As illustrated in FIG. 2, the CF substrate 113 adhered onto the sealing layer 111 via the adhesion layer 112 includes the substrate 1131, and the color filter 1132 and the black matrix 1133 formed on the surface of the substrate 1131 that is located lower in the Z axis direction.

As such, the manufacturing of the organic EL display panel 10, which is an organic EL display element, is completed.

Note that, although illustration is not provided in the drawings, the manufacturing of the organic EL display device 1 is completed by annexing the drive control circuit portion 20 to the organic EL display panel 10 (refer to FIG. 1), and then performing aging processing. The aging processing is performed by, for instance, causing the organic EL display device 1 to conduct until the mobility of holes in the organic EL display device 1 reaches ⅒ or lower with respect to the hole injection characteristics before the aging processing. More specifically, in the aging processing, the organic EL display device 1 is electrified for a predetermined time period while maintaining the luminous intensity of the organic EL display device 1 to be at least equal to the luminous intensity upon actual usage and at most three times the luminous intensity upon actual usage.

(ii) Method of Forming TFT Substrate 101

Subsequently, description is provided on a method of forming the TFT substrate 101, with reference to FIG. 4B, and FIGS. 5A through 5C, FIGS. 6A through 6C, FIG. 7, and FIGS. 8A and 8B.

Figure 4B:
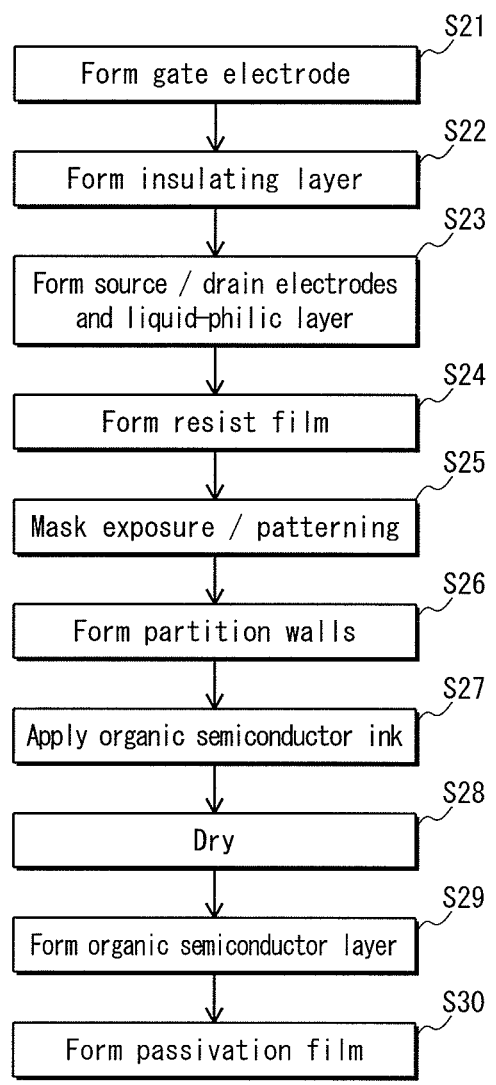
FIG. 4B is a process flow diagram providing an overview of a method of forming the TFT substrate 101.

As illustrated in FIG. 5A, the gate electrodes 1012a, 1012b are formed on a main surface of the substrate 1011 (Step S21 in FIG. 4B). Note that the formation of the gate electrodes 1012a, 1012b may be performed according to the above-described method applied in the formation of the anode 103.

Then, as illustrated in FIG. 5B, the insulating layer 1013 is formed so as to cover the substrate 1011 and the gate electrodes 1012a, 1012b (Step S22 in FIG. 4B). Then, as illustrated in FIG. 5C, the source electrodes 1014a, 1014b, the drain electrodes 1014c, 1014d, the connection wire 1015, and the liquid-philic layers 1019a, 1019b are formed on a main surface of the insulating layer 1013 (Step S23 in FIG. 4B). In this step, note that the position of each of the liquid-philic layers 1019a, 1019b with respect to the corresponding one of the source electrodes 1014a, 1014b and the corresponding one of the drain electrodes 1014c, 1014d, is defined such that (i) the relative position of the liquid-philic layer 1019a with respect to the source electrode 1014a and the drain electrode 1014c, and (ii) the relative position of the liquid-philic layer 1019b with respect to the source electrode 1014b and the drain electrode 1014d are in accordance with the positional relationships described above. Such arrangements are made in the present step taking into account the partition walls 1016 that are formed through the following steps.

Further, due to the source electrodes 1014a, 1014b, the drain electrodes 1014c, 1014d, and the liquid-philic layers 1019a, 1019b being formed as described above, the exposed portion 1013a of the insulating layer 1013 is formed at the left side of the source electrode 1014a and the drain electrode 1014c in the X axis direction, and the exposed portion 1013b of the insulating layer 1013 is formed at the right side of the source electrode 1014b and the drain electrode 1014d in the X axis direction.

Here, note that the forming, on the insulating layer 1013, of the source electrodes 1014a, 1014b, the drain electrodes 1014c, 1014d, the connection wire 1015, and the liquid-philic layers 1019a, 1019b can be performed by first executing a substep of forming a metal layer covering the insulating layer 1013 entirely, and then, by executing a substep of etching and thereby dividing the metal layer into the source electrodes 1014a, 1014b, the drain electrodes 1014c, 1014d, the connection wire 1015, and the liquid-philic layers 1019a, 1019b.

Then, as illustrated in FIG. 6A, a film 10160 of photoresist material for forming the partition walls 1016 is deposited so as to accumulate and cover the source electrodes 1014a, 1014b, the drain electrodes 1014c, 1014d, the connection wire 1015, the liquid-philic layers 1019a, 1019b, and the exposed portions 1013a, 1013b of the insulating layer 1013 (Step S24 in FIG. 4B).

Then, as illustrated in FIG. 6B, a mask 501 is disposed above the film 10160 so deposited, and mask exposure and patterning of the photoresist material film 10160 is performed (Step S25 in FIG. 4B). Here, note that the mask 501 has window portions 501a, 501b, 501c, and 501d formed therein which correspond in position to the partition walls 1016 to be formed. Note that, although not illustrated in FIG. 6B, the mask 501 has additional window portions formed therein which also correspond in position to the partition walls 1016 to be formed.

The partition walls 1016, illustration of which is provided in FIG. 6C, are formed in such a manner as described above (Step S26 in FIG. 4B). The partition walls 1016 define a plurality of apertures including the apertures 1016a, 1016b, and 1016c. At the bottom portion of the aperture 1016a, the partition walls 1016 defining the aperture 1016a surround the connection wire 1015. At the bottom portion of the aperture 1016b, the partition walls 1016 defining the aperture 1016b surround the source electrode 1014a, the drain electrode 1014c (undepicted in FIG. 6C), and the liquid-philic layer 1019a. At the bottom portion of the aperture 1016c, the partition walls 1016 defining the aperture 1016c surround the source electrode 1014b, the drain electrode 1014d (undepicted in FIG. 6C), and the liquid-philic layer 1019b. In each of the apertures 1016b, 1016c, the corresponding one of the liquid-philic layers 1019a, 1019b is located apart from the corresponding one of the source electrodes 1014a, 1014b and the corresponding one of the drain electrodes 1014c, 1014d (undepicted in FIG. 6C). Further, as illustrated in FIG. 6C, one end portion of each of the liquid-philic layers 1019a, 1019b is in contact with the partition walls 1016 in the corresponding one of the apertures 1016b, 1016c.

Figure 7:
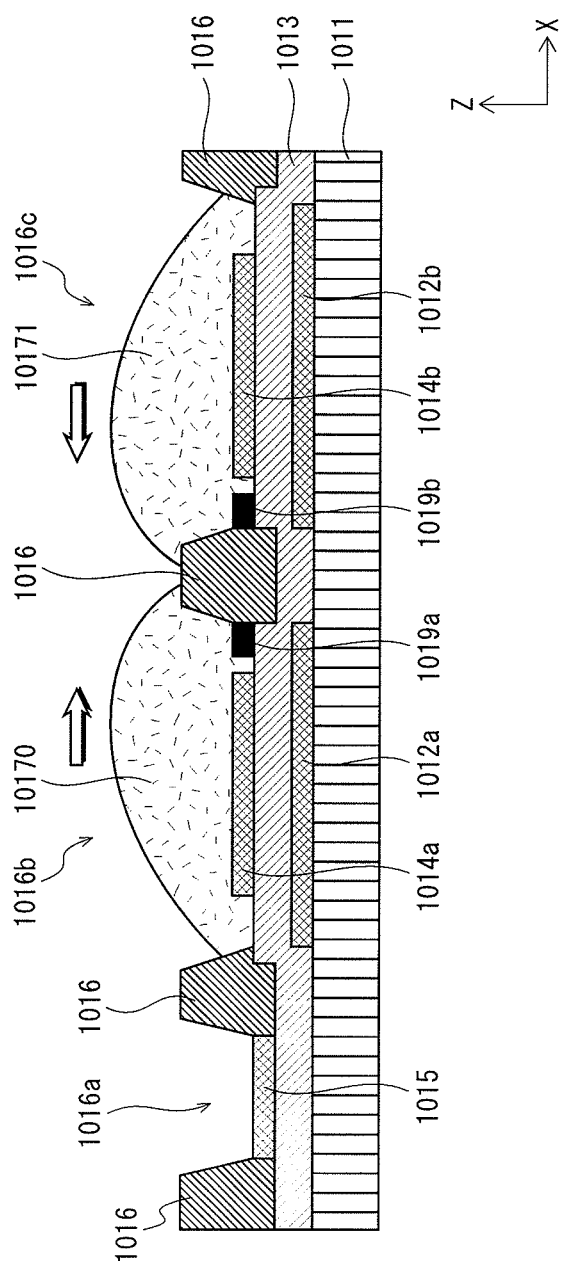
FIG. 7 is a schematic process diagram illustrating a procedure among procedures involved in the manufacturing of the TFT substrate 101.

After the partition walls 1016 are formed, organic semiconductor ink 10170, 10171, for respectively forming the organic semiconductor layers 1017a, 1017b, are respectively applied to the apertures 1016b, 1016c defined by the partition walls 1016, as illustrated in FIG. 7 (Step S27 in FIG. 4B). Here, it should be noted that the surface shape of the organic semiconductor ink 10170 applied with respect to the aperture 1016b is not symmetrical in the X axis direction. Rather, the surface shape of the organic semiconductor ink 10170 is biased in the right direction along the X axis (the direction indicated by the arrow above the organic semiconductor ink 10170 in FIG. 7). On the other hand, the surface shape of the organic semiconductor ink 10171 applied with respect to the aperture 1016c is biased in the left direction along the X axis (the direction indicated by the arrow above the organic semiconductor ink 10171 in FIG. 7). The surfaces of the organic semiconductor ink 10170, 10171 exhibit such shapes due to the liquid-philic layers 1019a, 1019b being formed in the apertures 1016b, 1016c.

By controlling the surface shapes of the organic semiconductor ink 10170, 10171 in such a manner, the organic semiconductor ink 10170, 10171 is prevented from overflowing and flowing out towards undesirable areas including the aperture 1016a. The specific reasons as to why such a problem can be prevented are described later in the present disclosure.

Subsequently, by drying the organic semiconductor ink 10170, 10171 (Step S28 in FIG. 4B), the organic semiconductor layers 1017a, 1017b are respectively formed with respect to the apertures 1016b, 1016c as illustrated in FIG. 8A (Step S29 in FIG. 4B).

Finally, the formation of the TFT substrate 101 is completed by forming the passivation film 1018 so as to entirely cover underlayers therebelow with the exception of a contact area including the aperture 1016a, etc., as illustrated in FIG. 8B (Step S30 in FIG. 4B).

6. Effects Achieved

For the reasons explained in the following, the TFT substrate 101 pertaining to the present embodiment, the organic EL display panel 10 including the TFT substrate 101, and the organic EL display device 1 having a structure including the organic EL display panel 10 are ensured to have high quality, and at the same time, to have high yield in the manufacture thereof.

As illustrated in FIG. 7, according to the TFT substrate 101 pertaining to the present embodiment, when the organic semiconductor ink 10170, 10171, which are for respectively forming the organic semiconductor layers 1017a, 1017b, are respectively applied with respect to the apertures 1016b, 1016c, the surface shape of each of the organic semiconductor ink 10170, 10171 is such that, the height of the surface thereof is greater at one side of the corresponding one of the apertures 1016b, 1016c relatively close to the partition walls 1016 between the apertures 1016b and 1016c than at the other side that is relatively distant from the partition walls 1016. Due to this, in the manufacture of the TFT substrate 101 pertaining to the present embodiment, the organic semiconductor ink 10170, 10171 is prevented from overflowing and flowing out towards undesirable areas (the aperture 1016a, which is not a channel portion, and the like). As such, in the TFT substrate 101 pertaining to the present embodiment, the formation of the organic semiconductor layers 1017a, 1017b at only desired areas (i.e., the channel portions) is realized. In addition, by preventing the organic semiconductor ink 10170, 10171 from overflowing, the layer thicknesses of the organic semiconductor layers 1017a and 1017b (i.e., the layer thickness of an organic semiconductor layer 1017) can be controlled with high precision.

As such, the TFT substrate 101 pertaining to the present embodiment, the organic EL display panel 10 including the TFT substrate 101, and the organic EL display device 1 having a structure including the organic EL display panel 10, upon formation of the organic semiconductor layers 1017a, 1017b in the TFT substrate 101, prevents the formation of the organic semiconductor layers 1017, 1017b at undesirable areas, and thereby ensures high quality.

Note that the above-described effect is a result of (i) the formation of the liquid-philic layers 1019a, 1019b at the bottom portions of the apertures 1016b, 1016c, and (ii) a specific relationship between the liquid repellency of the surfaces of the partition walls 1016, the liquid repellency of the surface of the insulating layer 1013, and the liquid repellency of the surfaces of the source electrodes 1014a, 1014b and the drain electrodes 1014c, 1014d. In specific, the following relationship is satisfied when denoting: the liquid repellency of the surfaces of the partition walls 1016 as $R_W$; the liquid repellency of the surface of the insulating layer 1013 as $R_I$; and the liquid repellency of the surfaces of the source electrodes 1014a, 1014b, the drain electrodes 1014c, 1014d, and the liquid-philic layers 1019a, 1019b as $R_E$.

$$R_W > R_I > R_E \qquad \text{[Math. 3]}$$

Note that, the liquid repellency denoted by each of $R_W$, $R_I$, and $R_E$ indicates the liquid repellency of the corresponding surface(s) with respect to the organic semiconductor ink 10170, 10171.

In the meantime, when seen from an opposite point of view, or that is, in terms of wettability, the characteristics of the surfaces of the partition walls 1016, the characteristics of the surface of the insulating layer 1013, and the characteristics of the surfaces of the source electrodes 1014a, 1014b, the drain electrodes 1014c, 1014d, and the liquid-philic layers 1019a, 1019b satisfy the following relationship.

$$W_W < W_I < W_E \qquad \text{[Math. 4]}$$

In Math. 3, $W_W$ denotes the wettability of the surfaces of the partition walls 1016, $W_I$ denotes the wettability of the surface of the insulating layer 1013, and $W_E$ denotes the wettability of the surfaces of the source electrodes 1014a, 1014b, the drain electrodes 1014c, 1014d, and the liquid-philic layers 1019a, 1019b.

As described up to this point, according to the present embodiment, control is performed of (i) the formation of the liquid-philic layers 1019a, 1019b at the bottom portion of the apertures 1016b, 1016c, and (ii) the relationship between the liquid repellency of the surfaces of the partition walls 1016, the liquid repellency of the surface of the insulating layer 1013, and the liquid repellency of the surfaces of the source electrodes 1014a, 1014b, the drain electrodes 1014c, 1014d, and the liquid-philic layers 1019a, 1019b. Due to this, the surfaces of the organic semiconductor ink 10170, 10171, upon application in the manufacturing of the TFT substrate 101, exhibit the shapes as illustrated in FIG. 7. Hence, the organic semiconductor ink 10170, 10171 is effectively prevented from overflowing and flowing out towards undesirable areas such as the inside of the aperture 1016a. This results in the formation of the organic semiconductor layers 1017a, 1017b at undesirable portions being prevented. As such, the TFT substrate 101, the organic EL display panel 10, and the organic EL display device 1 are ensured to have high quality, and at the same time, to have high yield in the manufacture thereof.

Further, as illustrated in FIG. 3A, at the bottom portion of each of the apertures 1016b, 1016c, the corresponding one of the liquid-philic layers 1019a, 1019b is disposed at one side of the bottom portion, and the corresponding one of the source electrodes 1014a, 1014b and the corresponding one of the drain electrodes 1014c, 1014d are each disposed such that a center of area thereof coincides with the corresponding one of the lines $L_1$, $L_2$ passing through the center of area of the bottom portion. Due to this, at the bottom portion of each of the apertures 1016b, 1016c, the corresponding one of the exposed portions 1013a, 1013b is formed at a side opposite the side at which the corresponding one of the liquid-philic layers 1019a, 1019b is formed. Accordingly, at the bottom portion of the aperture 1016b, the portion of the insulating layer 1013 remaining exposed occupies a greater area in the left side of the bottom portion in the X axis direction compared to in the right side. Similarly, at the bottom portion of the aperture 1016c, the portion of the insulating layer 1013 remaining exposed occupies a greater area in the right side of the bottom portion in the X axis direction compared to in the left side. Such a relationship is also effective in achieving the above-described effects.

Embodiment 2

In the following, description is provided on a structure of a TFT substrate pertaining to embodiment 2 of the present disclosure, with reference to FIG. 9A. FIG. 9A corresponds to FIG. 3A in embodiment 1, and other than differences between the structures illustrated in FIG. 9A and FIG. 3A, embodiment 2 is similar to embodiment 1. As such, the structures similar between embodiment 2 and embodiment 1 are not illustrated in the drawings nor will be described in the following.

As illustrated in FIG. 9A, partition walls 2016 in the TFT substrate pertaining to the present embodiment define two apertures, namely an aperture 2016a and an aperture 2016b. At a bottom portion of the aperture 2016b, a source electrode 2014a, a drain electrode 2014c, and a liquid-philic layer 2019b are disposed. Further, at a bottom portion of the aperture 2016a, a connection wire 2015 is disposed. This is similar to the aperture 1016a in embodiment 1.

The source electrode 2014a and the drain electrode 2014c at the bottom portion of the aperture 2016b each have a T-shape in plan view. Further, in the aperture 2016b, a portion of the source electrode 2014a extending in the X axis direction faces a portion of the drain electrode 2014c extending in the X axis direction. In the meantime, the liquid-philic layer 2019b has a shape of an elongated rectangle whose long sides extend in the Y axis direction. This is similar to the liquid-philic layers 1019a, 1019b in embodiment 1.

Further, a center of area of each of the source electrode 2014a and the drain electrode 2014c coincides with a line $L_3$ passing through a center of area of the bottom portion of the aperture 2016b in the X axis direction. On the other hand, as illustrated in FIG. 9A, a center of area of the liquid-philic layer 2019b is offset from the line $L_3$ passing through the center of area of the bottom portion of the aperture 2016b in the X axis direction, in the right direction along the X axis.

In addition, at the bottom portion of the aperture 2016b before the formation of an organic semiconductor layer, a portion of an insulating layer 2013 remaining exposed occupies a greater area in the left side of the bottom portion in the X axis direction compared to in the right side, as illustrated in FIG. 9A.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 3

In the following, description is provided on a structure of a TFT substrate pertaining to embodiment 3 of the present disclosure, with reference to FIG. 9B. FIG. 9B corresponds to FIG. 3A in embodiment 1, and other than differences between the structures illustrated in FIG. 9B and FIG. 3A, embodiment 3 is similar to embodiments 1 and 2. As such, the structures similar between embodiment 3 and embodiments 1 and 2 are not illustrated in the drawings nor will be described in the following.

As illustrated in FIG. 9B, partition walls 3016 in the TFT substrate pertaining to the present embodiment also define two apertures, namely an aperture 3016a and an aperture 3016b. At a bottom portion of the aperture 3016b, a source electrode 3014a, a drain electrode 3014c, and a liquid-philic layer 3019b are disposed. Further, at a bottom portion of the aperture 3016a, a connection wire 3015 is disposed. This is similar to the corresponding apertures in embodiments 1 and 2.

The source electrode 3014a and the drain electrode 3014c at the bottom portion of the aperture 3016b each have a comb shape in plan view and each have a comb-teeth portion. Further, in the aperture 3016b, the comb teeth portion of the source electrode 3014a faces the comb teeth portion of the drain electrode 3014c. Further, a center of a total of areas of the source electrode 3014a and the drain electrode 3014c at the bottom portion of the aperture 3016b coincides with a line $L_4$ passing through a center of area of the bottom portion of the aperture 3016b in the X axis direction.

On the other hand, similar as in embodiment 2, etc., a center of area of the liquid-philic layer 3019b is offset from the line $L_4$ passing through the center of area of the bottom portion of the aperture 3016b in the X axis direction in the right direction along the X axis.

In the TFT substrate pertaining to the present embodiment, the liquid-philic layer 3019b is in contact with the side surface portion of the partition walls 3016 facing the aperture 3016b at a right side thereof in the X axis direction, similar as in the above.

In addition, at the bottom portion of the aperture 3016b before the formation of an organic semiconductor layer, a portion of an insulating layer 3013 remaining exposed occupies a greater area in the left side of the bottom portion in the X axis direction compared to in the right side, as illustrated in FIG. 9B.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

In addition, according to the present embodiment, the source electrode 3014a and the drain electrode 3014 each have a comb shape, and further, the comb-teeth portion of the source electrode 3114a faces the comb-teeth portion of the drain electrode 3114c. As such, the areas of the electrodes facing the corresponding electrode increase, which leads to an improvement in transistor characteristics.

Embodiment 4

In the following, description is provided on a structure of a TFT substrate pertaining to embodiment 4 of the present disclosure, with reference to FIG. 9C. FIG. 9C corresponds to FIG. 3A in embodiment 1, and other than differences between the structures illustrated in FIG. 9C and FIG. 3A, embodiment 4 is similar to embodiments 1, 2, and 3. As such, the structures similar between embodiment 4 and embodiments 1, 2, and 3 are not illustrated in the drawings nor will be described in the following.

As illustrated in FIG. 9C, partition walls 4016 in the TFT substrate pertaining to the present embodiment define two apertures, namely an aperture 4016a and an aperture 4016b. Further, each of the apertures 4016a, 4016b has an opening having a circular shape, and each of the apertures 4016a, 4016b has a bottom portion having a circular shape. At the bottom portion of the aperture 4016a, a connection wire 4015 having an outline of a circular shape or a shape of a circular arc is disposed. At the bottom portion of the aperture 4016b, a source electrode 4014a and a drain electrode 4014c each having an outline of a circular shape or a shape of a circular arc are disposed. At the bottom portion of the aperture 4016b, a liquid-philic layer 4019b is additionally disposed. The liquid-philic layer 4019b is formed along a bottom edge of a side surface portion of the partition walls 4016 facing the aperture 4016b and has a shape of circular arc.

Further, at the bottom portion of the aperture 4016b, each of the source electrode 4014a and the drain electrode 4014c is disposed such that a center of area thereof coincides with a line $L_5$ passing through a center of area of the bottom portion of the aperture 4016b. On the other hand, similar as in the above-described embodiments 1, 2, and 3, the liquid-philic layer 4019b is disposed so as to be offset from the line $L_5$ passing through the center of area of the bottom portion of the aperture 4016b in the right direction along the X axis.

In addition, at the bottom portion of the aperture 4016b before the formation of an organic semiconductor layer, a portion of an insulating layer 4013 remaining exposed occupies a greater area in the left side of the bottom portion in the X axis direction compared to in the right side, as illustrated in FIG. 9C.

The TFT substrate pertaining to the present embodiment, due to being provided with the structure described above, achieves the same effects as the structures described in embodiments 1, 2, and 3. In addition, similar as described in embodiment 1 above, an organic EL display panel and an organic EL display device including the TFT substrate pertaining to the present embodiment are ensured to have high quality, and at the same time, to have high yield in the manufacture thereof.

In addition, in the present embodiment, the source electrode 4014a and the drain electrode 4014c have the respective shapes as illustrated in FIG. 9C. As such, the areas of the electrodes facing the corresponding electrode increase, and further, a so-called "sneak current" is reduced.

Embodiment 5

In the following, description is provided on a structure of a TFT substrate pertaining to embodiment 5 of the present disclosure, with reference to FIG. 10A. FIG. 10A corresponds to FIG. 3A in embodiment 1, and other than differences between the structures illustrated in FIG. 10A and FIG. 3A, embodiment 5 is similar to embodiments 1, 2, 3, 4, etc. As such, the structures similar between embodiment 5 and embodiments 1, 2, 3, 4, etc., are not illustrated in the drawings nor will be described in the following.

As illustrated in FIG. 10A, partition walls 5016 in the TFT substrate pertaining to the present embodiment define two apertures, namely an aperture 5016a and an aperture 5016b. Further, each of the apertures 5016a, 5016b has an opening having a quadrilateral shape and a bottom portion having a quadrilateral shape, similar as in embodiments 1, 2, and 3 above. At the bottom portion of the aperture 5016a, a connection wire 5015 having an outline of a substantially square shape or a rectangular shape is disposed. At the bottom portion of the aperture 5016b, a source electrode 5014a, a drain electrode 5014c, and a liquid-philic layer 5019b each having an outline of a substantially square shape or a rectangular shape are disposed.

At the bottom portion of the aperture 5016b, the source electrode 5014a and the drain electrode 5014c have the same length in the X axis direction, and further, the source electrode 5014a and the drain electrode 5014c are each disposed such that a center of area thereof in the X axis direction coincides with a line $L_6$ passing through a center of area of the bottom portion of the aperture 5016b.

Here, it should be noted that the present embodiment is characterized in that both ends of the liquid-philic layer 5019b in the Y axis direction are located apart from a side surface portion of the partition walls 5016 facing the aperture 5016b.

In addition, at the bottom portion of the aperture 5016b before the formation of an organic semiconductor layer, a portion of an insulating layer 5013 remaining exposed occupies a greater area in the left side of the bottom portion in the X axis direction compared to in the right side, as illustrated in FIG. 10A.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 6

In the following, description is provided on a structure of a TFT substrate pertaining to embodiment 6 of the present disclosure, with reference to FIG. 10B. FIG. 10B corresponds to FIG. 3A in embodiment 1, and other than differences between the structures illustrated in FIG. 10B and FIG. 3A, embodiment 6 is similar to embodiments 1, 2, 3, 4, 5, etc. As such, the structures similar between embodiment 6 and embodiments 1, 2, 3, 4, 5, etc., are not illustrated in the drawings nor will be described in the following.

As illustrated in FIG. 10B, partition walls 6016 in the TFT substrate pertaining to the present embodiment define two apertures, namely an aperture 6016a and an aperture 6016b. Further, each of the apertures 6016a, 6016b has an opening having a quadrilateral shape and a bottom portion having a quadrilateral shape, similar as in embodiments 1, 2, 3, and 5 above. At the bottom portion of the aperture 6016a, a connection wire 6015 having a substantially square shape or a rectangular shape is disposed. At the bottom portion of the aperture 6016b, a drain electrode 6014c having a substantially square shape or a rectangular shape is disposed.

On the other hand, a source electrode 6014a also disposed at the bottom portion of the aperture 6016b has a U-shape in plan view, and faces a part of the drain electrode 6014c at three sides thereof.

In addition, a liquid-philic layer 6019b is also disposed at the bottom portion of the 6016b. The liquid-philic layer 6019b is formed at a side of the bottom portion opposite the side to which the aperture 6016a is adjacent. Further, similar as in embodiment 5 above, both ends of the liquid-philic layer 6019*b* are located apart from a side surface portion of the partition walls 6016 facing the aperture 6016*b*.

Here, at the bottom portion of the aperture 6016*b*, a center of a total of areas of the source electrode 6014*a*, the drain electrode 6014*c*, and the liquid-philic layer 6019*d* is offset from a line $L_7$ passing through a center of area of the bottom portion of the aperture 6016*b* in the right direction along the X axis.

In addition, in the TFT substrate pertaining to the present embodiment, each of the upper and lower portions of the source electrode 6014*a* in the Y axis direction is in contact with the side surface portion of the partition walls 6016 facing the aperture 6016*b* while both sides in the X axis direction (the left and right sides) of the source electrode 6014*a* are located apart from the side surface portion facing the aperture 6016*b*. On the other hand, the left side of the drain electrode 6014*b* in the X axis direction is in contact with the side surface portion facing the aperture 6016*b* while the right side of the drain electrode 6014*b* in the X axis direction is located apart from the side surface portion facing the aperture 6016*b*.

In addition, at the bottom portion of the aperture 6016*b* before the formation of an organic semiconductor layer, a portion of an insulating layer 6013 remaining exposed occupies a greater area in the left side of the bottom portion in the X axis direction compared to in the right side, as illustrated in FIG. 10B.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 7

In the following, description is provided on a structure of a TFT substrate pertaining to embodiment 7 of the present disclosure, with reference to FIG. 10C. FIG. 10C corresponds to FIG. 3A in embodiment 1, and other than differences between the structures illustrated in FIG. 10C and FIG. 3A, embodiment 7 is similar to embodiments 1, 2, 3, 4, 5, 6, etc. As such, the structures similar between embodiment 7 and embodiments 1, 2, 3, 4, 5, 6, etc., are not illustrated in the drawings nor will be described in the following.

As illustrated in FIG. 10C, partition walls 7016 in the TFT substrate pertaining to the present embodiment define two apertures, namely an aperture 7016*a* and an aperture 7016*b*. Further, each of the apertures 7016*a*, 7016*b* has an opening having a quadrilateral shape and a bottom portion having a quadrilateral shape, similar as in embodiments 1, 2, 3, 5, and 6 above. At the bottom portion of the aperture 7016*a*, a connection wire 7015 having a rectangular shape is disposed. At the bottom portion of the aperture 7016*b*, a source electrode 7014*a*, a drain electrode 7014*c*, and a liquid-philic layer 7019*b* each having a rectangular shape are disposed.

The source electrode 7014*a* and the drain electrode 7014*b* disposed at the bottom portion of the aperture 7016*b* are symmetrical with respect to a line $L_8$ passing through a center of area of the bottom portion of the aperture 7016*b*.

On the other hand, the liquid-philic layer 7019*c* is disposed such that a center thereof is offset from the line $L_8$ passing through the center of area of the bottom portion of the aperture 7016*b* in the right direction along the X axis. Further, the liquid-philic layer 7019*b* is in contact with a bottom edge of a side surface portion of the partition walls 7016 facing the aperture 7017*b*.

In addition, at the bottom portion of the aperture 7016*b* before the formation of an organic semiconductor layer, a portion of an insulating layer 7013 remaining exposed occupies a greater area in the left side of the bottom portion in the X axis direction compared to in the right side, as illustrated in FIG. 10C.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

[Other Matters]

In the above-described embodiments 1 through 7, description has been provided of examples where, within a side of an aperture in a direction opposite the first direction (i.e., a side in a direction of an adjacent aperture), a portion exists where a source electrode, a drain electrode, nor a liquid-philic layer exists and thus, where an insulating layer is in direct contact with an organic semiconductor layer. However, the side of the aperture in the direction opposite the first direction may include a portion of the source electrode, a portion of the drain electrode, and a portion of the liquid-philic layer, provided that the liquid-philic layer is disposed such that a center of area thereof is offset from a center of area of the bottom portion of the aperture in the first direction.

In the above-described embodiments 1 through 7, description has been provided by taking as an example a TFT substrate to be used in the organic EL display panel 10. However, the TFT substrate may alternatively be used in a liquid crystal display panel, a field emission display panel, etc. Further, the TFT substrate may also be used in an electronic paper, etc.

In addition, the materials described in the above-described embodiments 1 through 7 are mere examples of such materials that may be used. As such, other materials may be used as necessary.

In addition, as illustrated in FIG. 2, the organic EL display panel 10 pertaining to embodiment 1 is a top-emission type organic EL display panel. However, the organic EL display panel may alternatively be a bottom-emission type organic EL display panel. In such a case, the materials to be used for forming the organic EL display panel and the layout design of the organic EL display panel may be changed as necessary.

Figure 11A:
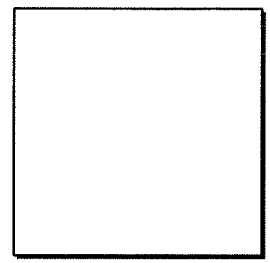
FIG. 11A is a schematic plan view illustrating a shape of an opening of an aperture defined by partition walls in a TFT substrate pertaining to modification 1.
Figure 11B:
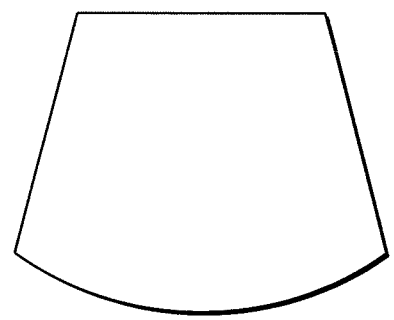
FIG. 11B is a schematic plan view illustrating a shape of an opening of an aperture defined by partitions wall in a TFT substrate pertaining to modification 2.
Figure 11C:
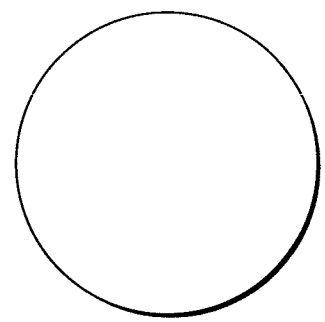
FIG. 11C is a schematic plan view illustrating a shape of an opening of an aperture defined by partition walls in a TFT substrate pertaining to modification 3.

In addition, in the above, description has been provided that the apertures defined by the partition walls each have an opening having a rectangular shape or a substantially circular shape. However, the apertures defined by the partition walls may alternatively have openings of various shapes. For instance, an aperture may have an opening having a square shape as illustrated in FIG. 11A, or may have an opening having a shape as illustrated in FIG. 11B composed of one side being a circular arc and three remaining sides being straight lines. Further, as illustrated in FIG. 9C, an aperture may also have an opening having a circular shape. In addition, an aperture may have an opening having a circular shape as illustrated in FIG. 11C, and another aperture having the shape of a circular arc may be provided so as to partially surround the circular aperture. Needless to say, the shape of an opening of an aperture corresponding to a channel portion and the shape of an opening of an aperture corresponding to a non-channel portion are interchangeable.

In addition, in the above, description has been provided that the outflow of organic semiconductor ink toward an aperture to come in contact with an anode or the like is undesirable, and thus should be prevented. However, the outflow of organic semiconductor ink to other types of apertures may alternatively be prevented. For instance, the outflow of organic semiconductor ink towards a "repair aperture" may be prevented. Here, the repair aperture refers to an aperture that is used when a defect is found in a TFT device having been formed and the TFT device is repaired by newly forming a TFT element only with respect to a cell having a defect.

Further, in cases such as where great stress is exerted on partition walls in a TFT substrate, holes may be formed in the partition walls in order to relieve the stress exerted on the partition walls. In such cases, it is desirable that configuration be made such that organic semiconductor ink is prevented from flowing out towards the holes formed in the partition walls in order to relieve the stress exerted on the partition walls. Note that, although the formation of organic semiconductor layers with respect to the above-described holes formed in the partition walls is not problematic by itself, a problem arises when organic semiconductor ink flow out towards such holes formed in the partition walls since the amount of organic semiconductor ink remaining at areas at which the formation of organic semiconductor layers is desired decreases. As such, the outflow of organic semiconductor ink towards the above-described holes is undesirable since the control of the layer thicknesses of the organic semiconductor layers would become difficult. In other words, the outflow of organic semiconductor ink towards such holes formed in the partition walls may affect TFT performance. As such, it is desirable that measures be taken so as to prevent organic semiconductor ink from flowing out towards the above-described holes formed in the partition walls in order to relieve the stress exerted on the partition walls.

In the above, description has been provided on a structure in which the outflow of organic semiconductor ink towards a specific aperture is undesirable, and thus prevented. However, application to a structure not including such an aperture is also possible. In specific, in a structure where two or more apertures with respect to which organic semiconductor layers are to be formed are arranged adjacent to each other, partition walls may be formed such that organic semiconductor ink does not flow out from one aperture towards another. By forming such partition walls, the formation of the organic semiconductor layers can be performed while it is ensured that organic semiconductor ink for forming one organic semiconductor layer exists separately from organic semiconductor ink for forming the other organic semiconductor layer. As such, compared to a case where the formation of organic semiconductor layers is performed while applied organic semiconductor ink covers two adjacent apertures and the gap therebetween, it is easier to reduce the difference between layer thickness of an organic semiconductor layer to be formed with respect to one aperture and layer thickness of another organic semiconductor layer to be formed with respect to an adjacent aperture, and as a result, excellent semiconductor characteristics and an improvement in yield can be expected.

Further, in embodiments 1 through 7 above, description has been provided that the liquid-philic layers 1019a, 1019b, 2019a, 2019b, 3019b, 4019b, 5019b, 6019b, 7019b are formed by using the same metal material as the source electrodes 1014a, 1014b, 2014a, 3014a, 4014a, 5014a, 6014a, 7014a and the drain electrodes 1014c, 1014d, 2014c, 3014c, 4014c, 5014d, 6014c, 7014c. However, the present disclosure is not limited to this, and the material usable for forming the liquid-philic layers is not limited in this way. For instance, the liquid-philic layers may be formed by using metal material differing from the metal material used for forming the source electrodes and the drain electrodes. Alternatively, material other than metal material, such as resin material for instance, may be used as the material for forming the liquid-philic layers. When forming the liquid-philic layers by using resin material, the insulating layer (i.e., gate insulating layer) may be formed, for instance, by using a material not including fluorine, although an insulating layer (gate insulating layer) is commonly formed by using fluorine resin.

Here, it should be noted that, the formation of the liquid-philic layers 1019a, 1019b, 2019a, 2019b, 3019b, 4019b, 5019b, 6019b, 7019b by using the same metal material used for forming the source electrodes 1014a, 1014b, 2014a, 3014a, 4014a, 5014a, 6014a, 7014a and the drain electrodes 1014c, 1014d, 2014c, 3014c, 4014c, 5014d, 6014c, 7014c as described in embodiments 1 through 7 above is advantageous for not bringing about an increase in procedures during manufacture, and hence, in that a reduction in manufacturing cost is realized.

In addition, description has been provided in the above on a structure including an organic semiconductor layer formed by using organic semiconductor ink. However, a similar structure may alternatively be used for a structure including an inorganic semiconductor layer formed by using inorganic semiconductor ink. In such a case, the same effects as described above can be achieved. For instance, an amorphous metal oxide semiconductor may be used as the inorganic semiconductor material. It is expected for such semiconductors to be applied to displays, electronic papers, etc., for the transparency possessed thereby.

In terms of mobility, such semiconductors are materials that may potentially realize a movability of 3 to 20 $cm^2/Vs$, which is desirable in high performance LCD and organic electro-luminescence (EL) displays.

Some commonly-known, representative examples of an amorphous metal oxide semiconductor include an amorphous indium zinc oxide semiconductor (a-InZnO) containing indium (In) and zinc (Zn) and an amorphous indium gallium zinc oxide semiconductor (a-InGaZnO), which includes gallium (Ga) as a metal component in addition to indium (In) and zinc (Zn).

For details concerning such inorganic semiconductors, reference may be made to disclosure in International Application No. WO 2012/035281.

Further, in embodiment 1, description has been provided on a structure where two transistor elements are provided for each subpixel. However, the number of transistor elements to be provided with respect to each subpixel may be appropriately changed as necessary. For instance, only one transistor element may be provided with respect to each subpixel, or alternatively, more than three transistor elements may be provided with respect to each subpixel.

INDUSTRIAL APPLICABILITY

The invention disclosed in the present disclosure is applicable to a display device provided with a panel, such as an organic EL display panel, and is useful for realizing a TFT element having high quality by realizing high-definition.

REFERENCE SIGNS LIST 1 organic EL display device
10 organic EL display panel
20 drive control circuit portion 21-24 drive circuit
25 control circuit
101 TFT substrate
102 planarizing film
102a contact hole
103 anode
104 light-transmissive conduction film
105 hole injection layer
106 bank
107 hole transport layer
108 organic light-emitting layer
109 electron transport layer
110 cathode
111 sealing layer
112 adhesion layer
113 CF substrate
501 mask
1011, 1131 CF substrate
1012a, 1012b gate electrode
1013 insulating layer
1014a, 1014b, 2014a, 3014a, 4014a, 5014a, 6014a, 7014a source electrode
1014c, 1014d, 2014c, 3014c, 4014c, 5014c, 6014c, 7014c drain electrode
1015, 2015, 3015, 4015, 5015, 6015, 7015 connection wire
1016, 2016, 3016, 4016, 5016, 6016, 7016 partition walls
1016a, 1016b, 1016c, 2016a, 2016b, 3016a, 3016b, 4016a, 4016b, 5016a, 5016b, 6016a, 6016b, 7016a, 7016b aperture
1017a, 1017b organic semiconductor layer
1018 passivation film
1019a, 1019b, 2019b, 3019b, 4019b, 5019b, 6019b, 7019b liquid-philic layer
1132 color filter
1133 black matrix
10160 photoresist material film
10170, 10171 organic semiconductor ink

The invention claimed is:

1. A thin film transistor element comprising:
a gate electrode;
an insulating layer disposed on the gate electrode;
a source electrode and a drain electrode disposed on the insulating layer with a gap therebetween;
an organic semiconductor layer disposed on the source electrode and the drain electrode to cover the source electrode and the drain electrode and to fill the gap between the source electrode and the drain electrode, and in contact with the source electrode and the drain electrode;
a liquid-philic layer disposed on the insulating layer and having higher liquid philicity than the insulating layer, the liquid-philic layer being separated from the source electrode and the drain electrode, and
partition walls disposed on the insulating layer and having liquid-repellant surfaces, the partition walls defining at least a first aperture and a second aperture, wherein
the first aperture surrounds at least a part of each of the source electrode, the drain electrode, and the liquid-philic layer, a bottom portion of the first aperture includes a source electrode portion that is a bottom portion of the source electrode, a drain electrode portion that is a bottom portion of the drain electrode, and a liquid-philic layer portion that is a bottom portion of the liquid-philic layer,
the second aperture is spaced from the first aperture with a gap therebetween and the organic semiconductor layer is not disposed within an area of the second aperture, and
in a plan view of the bottom portion of the first aperture, a center of an area of the liquid-philic layer portion is offset from a center of an area of the bottom portion of the first aperture in a first direction opposite a direction in which the second aperture is spaced from the first aperture.

2. The thin film transistor element of claim 1, wherein
the bottom portion of the first aperture includes a first portion where the source electrode portion, the drain electrode portion, and the liquid-philic layer portion are not present and, where the insulating layer is in direct contact with the organic semiconductor layer, the first portion is disposed at an end of the bottom portion of the first aperture that is closest to the second aperture.

3. The thin film transistor element of claim 2, wherein
the bottom portion of the first aperture includes a second portion where the source electrode portion, the drain electrode portion, and the liquid-philic layer portion are not present and, where the insulating layer is in direct contact with the organic semiconductor layer, the second portion being within an area of the bottom portion of the first aperture located in the first direction with respect to the second aperture, and
in plan view of the bottom portion of the first aperture, an area of the first portion is greater than an area of the second portion.

4. The thin film transistor element of claim 1, wherein
the liquid-philic layer comprises a same material as a material of the source electrode and the drain electrode, and
the liquid-philic layer is spaced from each of the source electrode and the drain electrode.

5. The thin film transistor element of claim 1, wherein
in a plan view of the bottom portion of the first aperture,
a center of the areas of the source electrode portion and the drain electrode portion coincides with the center of the area of the bottom portion of the first aperture.

6. The thin film transistor element of claim 1, wherein
in a plan view of the bottom portion of the first aperture,
a center of the areas of the source electrode portion, the drain electrode portion, and the liquid-philic layer portion is offset from the center of the area of the bottom portion of the first aperture in the first direction.

7. The thin film transistor element of claim 1, wherein
at the bottom portion of the first aperture,
a side, in the first direction, of the liquid-philic layer portion is in contact with a side surface portion of the partition walls facing the first aperture.

8. The thin film transistor element of claim 1, wherein
a liquid repellency of the surfaces of the partition walls is greater than a liquid repellency of a surface of the insulating layer that is in contact with the organic semiconductor layer, and
the liquid repellency of the surface of the insulating layer that is in contact with the organic semiconductor layer is greater than a liquid repellency of a surface of each of the source electrode, the drain electrode, and the liquid-philic layer.

9. The thin film transistor element of claim 1, wherein
the organic semiconductor layer is disposed within an area of the first aperture, and the area of the first aperture comprise a channel portion, and
the area of the second aperture does not comprise a channel portion.

10. The thin film transistor element of claim 9, wherein
one of the source electrode and the drain electrode extends into a bottom portion of the second aperture, or the bottom portion of the second aperture includes a wire that electrically connects with one of the source electrode and the drain electrode.

11. An organic EL display element comprising:
the thin film transistor element of claim 1;
a planarizing film disposed above the thin film transistor element and having a contact hole disposed therein;
a lower electrode disposed so as to cover the planarizing film and a side surface of the planarizing film defining the contact hole, and electrically connected with one of the source electrode and the drain electrode;
an upper electrode disposed above the lower electrode; and
an organic light-emitting layer interposed between the lower electrode and the upper electrode.

12. An organic EL display element comprising:
the thin film transistor element of claim 9;
a planarizing film disposed above the thin film transistor element and having a contact hole disposed therein;
a lower electrode disposed so as to cover the planarizing film and a side surface of the planarizing film defining the contact hole, and electrically connected with one of the source electrode and the drain electrode;
an upper electrode disposed above the lower electrode; and
an organic light-emitting layer interposed between the lower electrode and the upper electrode, wherein
the contact hole is in communication with the second aperture of the thin film transistor element.

13. An organic EL display device comprising the organic EL display element of claim 11.

14. A method of manufacturing a thin film transistor element comprising:
forming a gate electrode on a substrate;
forming an insulating layer on the gate electrode;
forming a source electrode and a drain electrode, and a liquid-philic layer on the insulating layer, wherein the source electrode and the drain electrode are formed with a gap therebetween, and the liquid-philic layer is formed so as to be spaced from the source electrode and the drain electrode, the liquid-philic layer having higher liquid philicity than the insulating layer;
depositing a layer of photosensitive resist material above the insulating layer, such that the layer of photosensitive resist material covers the source electrode and the drain electrode;
forming partition walls on the insulating layer by performing mask exposure and patterning of the layer of photosensitive resist material, the partition walls having liquid-repellant surfaces and defining at least a first aperture and a second aperture; and
forming an organic semiconductor layer by applying an organic semiconductor material with respect to the first aperture and drying the applied organic semiconductor material, wherein the organic semiconductor layer is formed so as to be in contact with the source electrode and the drain electrode, wherein
the first aperture surrounds at least a part of each of the source electrode, the drain electrode, and the liquid-philic layer, such that a bottom portion of the first aperture includes a source electrode portion that is a bottom portion of the source electrode, a drain electrode portion that is a bottom portion of the drain electrode, and a liquid-philic layer portion that is a bottom portion of the liquid-philic layer,
the second aperture is spaced from the first aperture with a gap therebetween and the organic semiconductor layer is not disposed within an area of the second aperture, and
the partition walls are formed such that
in a plan view of the bottom portion of the first aperture, a center of an area of the liquid-philic layer portion is offset from a center of an area of the bottom portion of the first aperture in a first direction opposite a direction in which the second aperture is spaced from the first aperture.

15. The method of claim 14, wherein
the forming, on the insulating layer, of the source electrode, the drain electrode, and the liquid-philic layer includes:
forming a metal layer on the insulating layer; and
etching the formed metal layer.

16. The method of claim 14, wherein
the partition walls are formed such that the bottom portion of the first aperture includes a first portion where the source electrode portion, the drain electrode portion, and the liquid-philic layer portion are not present and, where the insulating layer is in direct contact with the organic semiconductor layer, the first portion is disposed at the end of the bottom portion of the first aperture that is closest to the second aperture.

17. The method of claim 16, wherein
the partition walls are formed such that
the bottom portion of the first aperture includes a second portion where the source electrode portion, the drain electrode portion, and the liquid-philic layer portion are not present and, where the insulating layer is in direct contact with the organic semiconductor layer, the second portion being within an area of the bottom portion of the first aperture located in the first direction, and
in a plan view of the bottom portion of the first aperture, an area of the first portion is greater than an area of the second portion.

18. The method of claim 14, wherein
the forming of the insulating layer, the forming of the source electrode, the drain electrodes, and the liquid-philic layer, the forming of the partition walls, and the forming of the organic semiconductor layer are performed such that
a liquid repellency of the surfaces of the partition walls is greater than a liquid repellency of a surface of the insulating layer that is to contact with the organic semiconductor layer, and
the liquid repellency of the surface of the insulating layer is greater than a liquid repellency of a surface of each of the source electrode, the drain electrode, and the liquid-philic layer.

* * * * *